(12) United States Patent
Zang et al.

(10) Patent No.: US 10,825,741 B2
(45) Date of Patent: Nov. 3, 2020

(54) METHODS OF FORMING SINGLE DIFFUSION BREAKS ON INTEGRATED CIRCUIT PRODUCTS COMPRISED OF FINFET DEVICES AND THE RESULTING PRODUCTS

(71) Applicant: GLOBALFOUNDRIES Inc., Grand Cayman (KY)

(72) Inventors: Hui Zang, Guilderland, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 154 days.

(21) Appl. No.: 16/196,413

(22) Filed: Nov. 20, 2018

(65) Prior Publication Data

US 2020/0161190 A1 May 21, 2020

(51) Int. Cl.
| | | |
|---|---|---|
| *H01L 21/8238* | (2006.01) | |
| *H01L 29/66* | (2006.01) | |
| *H01L 29/78* | (2006.01) | |
| *H01L 21/762* | (2006.01) | |
| *H01L 27/092* | (2006.01) | |

(52) U.S. Cl.
CPC ........ *H01L 21/823878* (2013.01); *H01L 21/76224* (2013.01); *H01L 21/823814* (2013.01); *H01L 21/823821* (2013.01); *H01L 21/823864* (2013.01); *H01L 27/0924* (2013.01); *H01L 29/66545* (2013.01); *H01L 29/66795* (2013.01); *H01L 29/7851* (2013.01)

(58) Field of Classification Search
CPC ....... H01L 21/823878; H01L 21/76224; H01L 21/823814; H01L 21/823821; H01L 21/823864; H01L 27/0924; H01L 29/66545; H01L 29/66795; H01L 29/7851
See application file for complete search history.

(56) References Cited

U.S. PATENT DOCUMENTS

| | | | |
|---|---|---|---|
| 8,846,491 B1 | 9/2014 | Pham et al. | |
| 9,362,181 B1 | 6/2016 | Xie et al. | |
| 9,761,495 B1 * | 9/2017 | Xie | ........ H01L 21/308 |
| 9,847,390 B1 | 12/2017 | Xie et al. | |
| 10,177,151 B1 * | 1/2019 | Wang | ............... H01L 29/66545 |
| 2014/0117454 A1 | 5/2014 | Liu et al. | |
| 2016/0020210 A1 * | 1/2016 | Liaw | ................ H01L 21/82387 257/369 |
| 2017/0200651 A1 * | 7/2017 | Lee | ................... H01L 21/76224 |
| 2020/0020570 A1 * | 1/2020 | Sung | .................. H01L 21/3065 |

* cited by examiner

*Primary Examiner* — Fernando L Toledo
*Assistant Examiner* — Neil R Prasad
(74) *Attorney, Agent, or Firm* — Hoffman Warnick LLC

(57) ABSTRACT

One illustrative IC product disclosed herein includes an isolation structure that separates a fin into a first fin portion and a second fin portion, an epi semiconductor material positioned on the first fin portion in a source/drain region of a transistor device, wherein a lateral gap is present between a first sidewall of the epi semiconductor material and a second sidewall of the SDB isolation structure, and a conductive source/drain structure that is conductively coupled to the epi semiconductor material, wherein a gap portion of the conductive source/drain structure is positioned in the gap and physically contacts the first sidewall and the second sidewall.

20 Claims, 19 Drawing Sheets

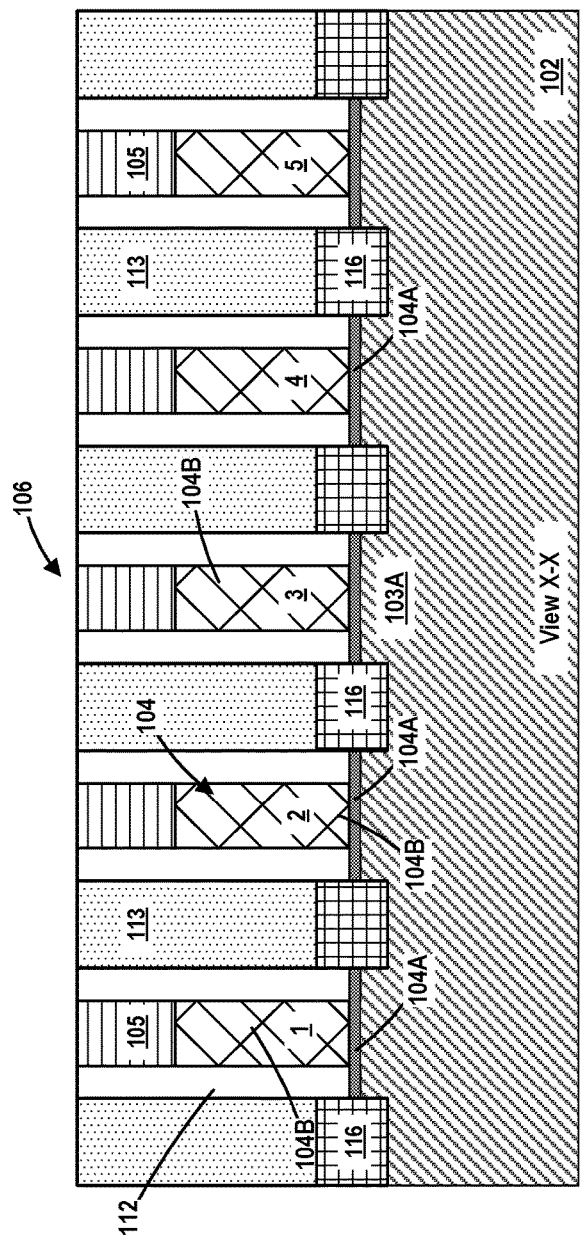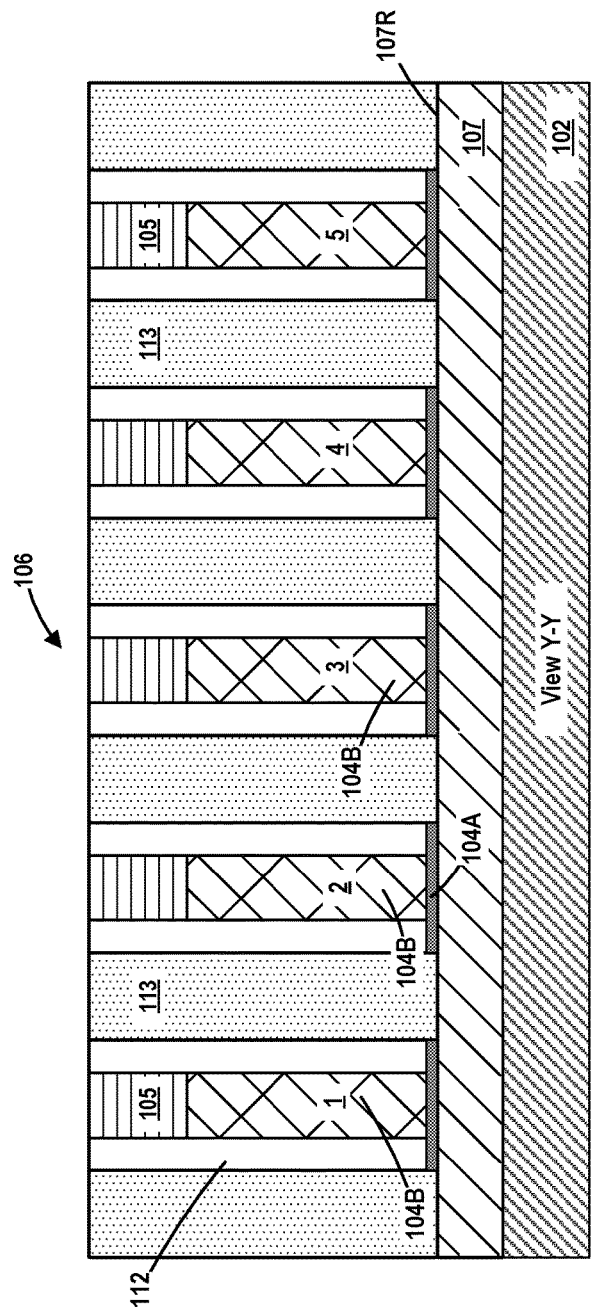

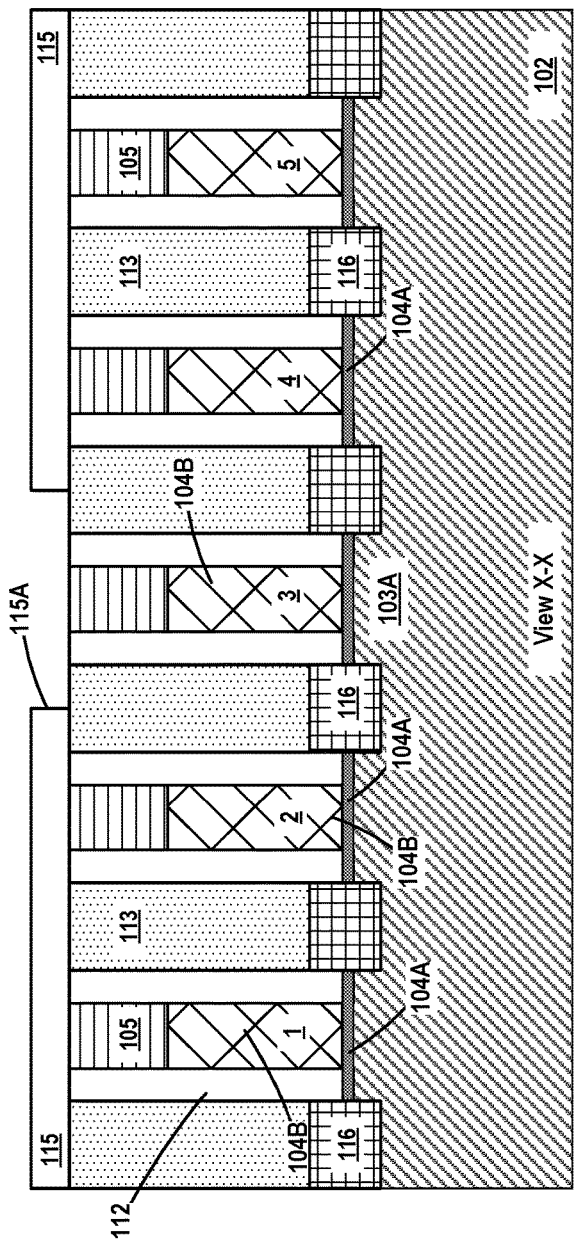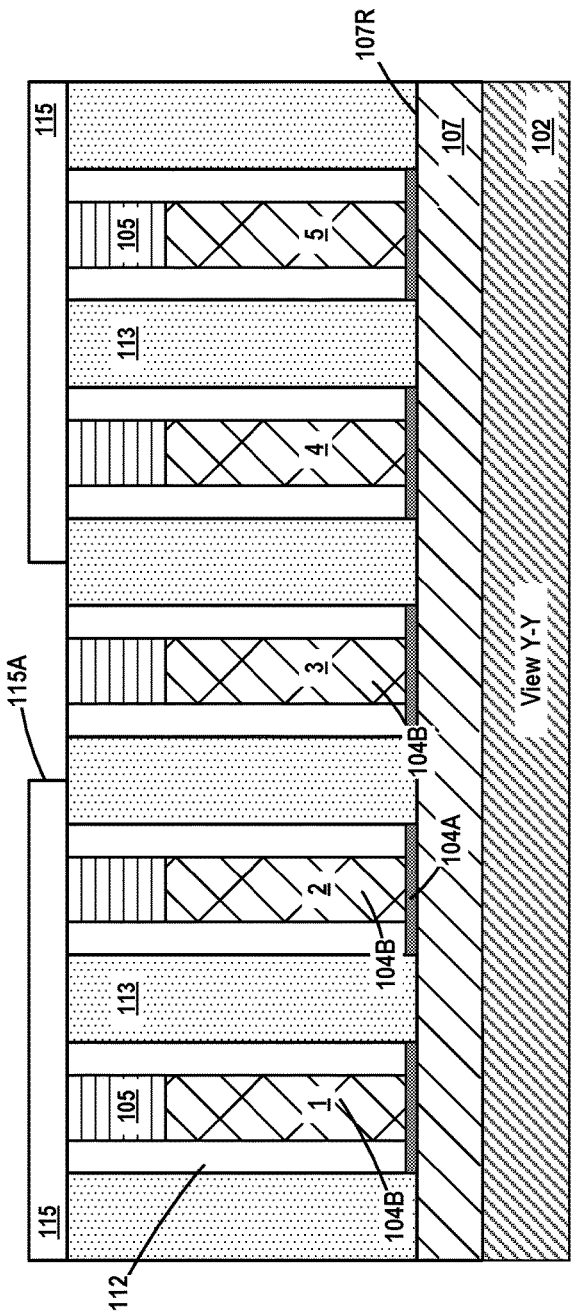

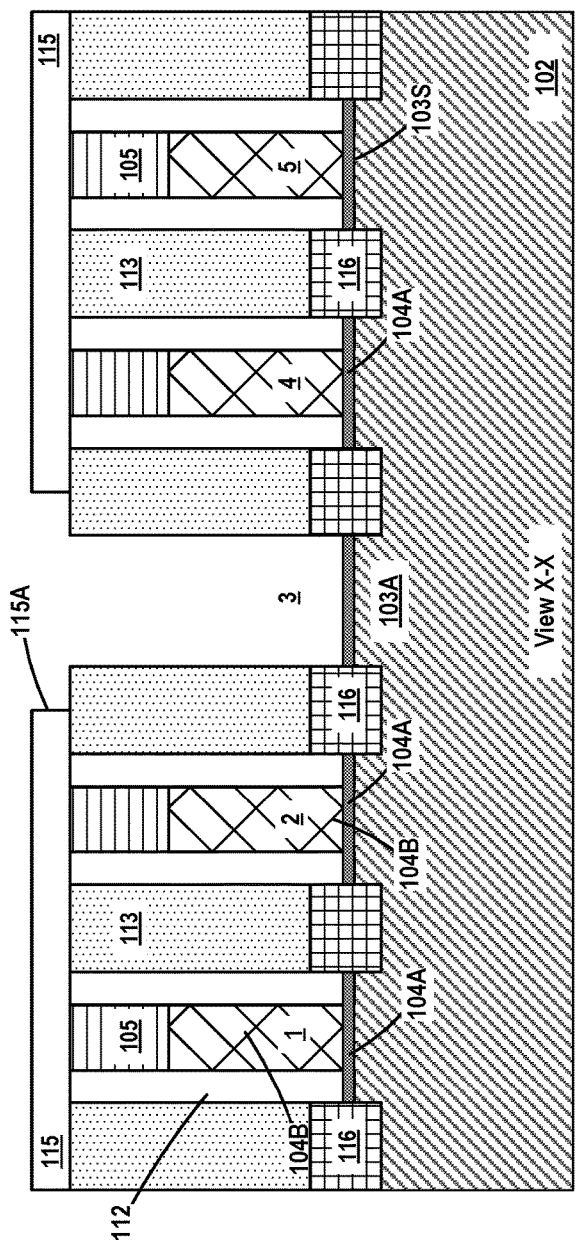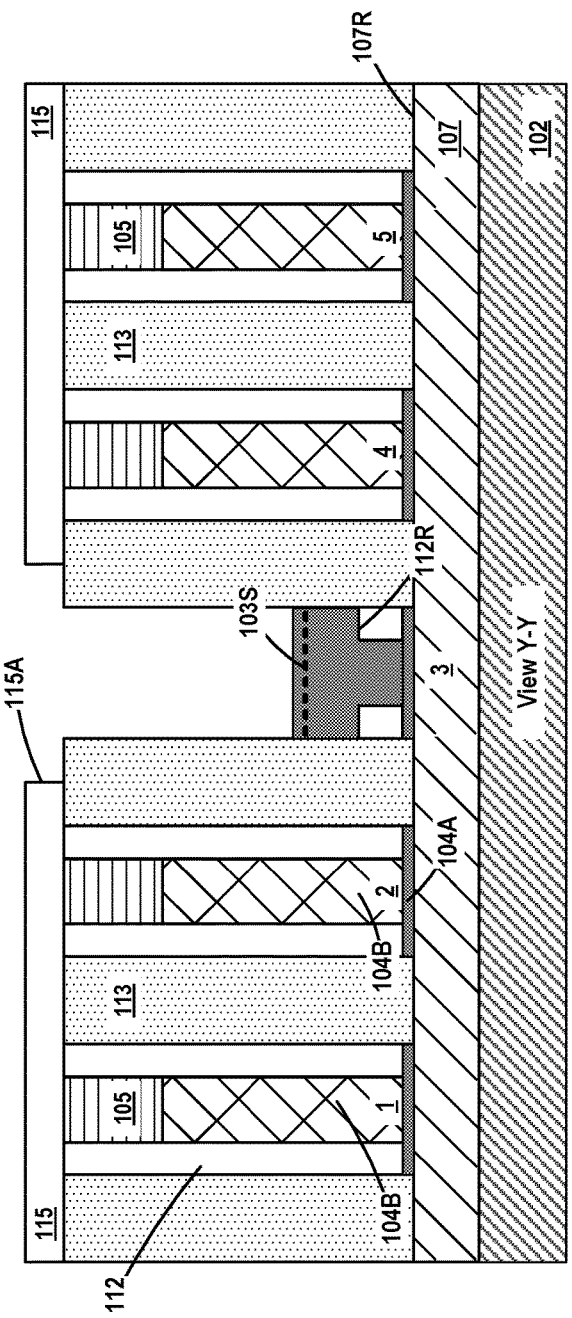

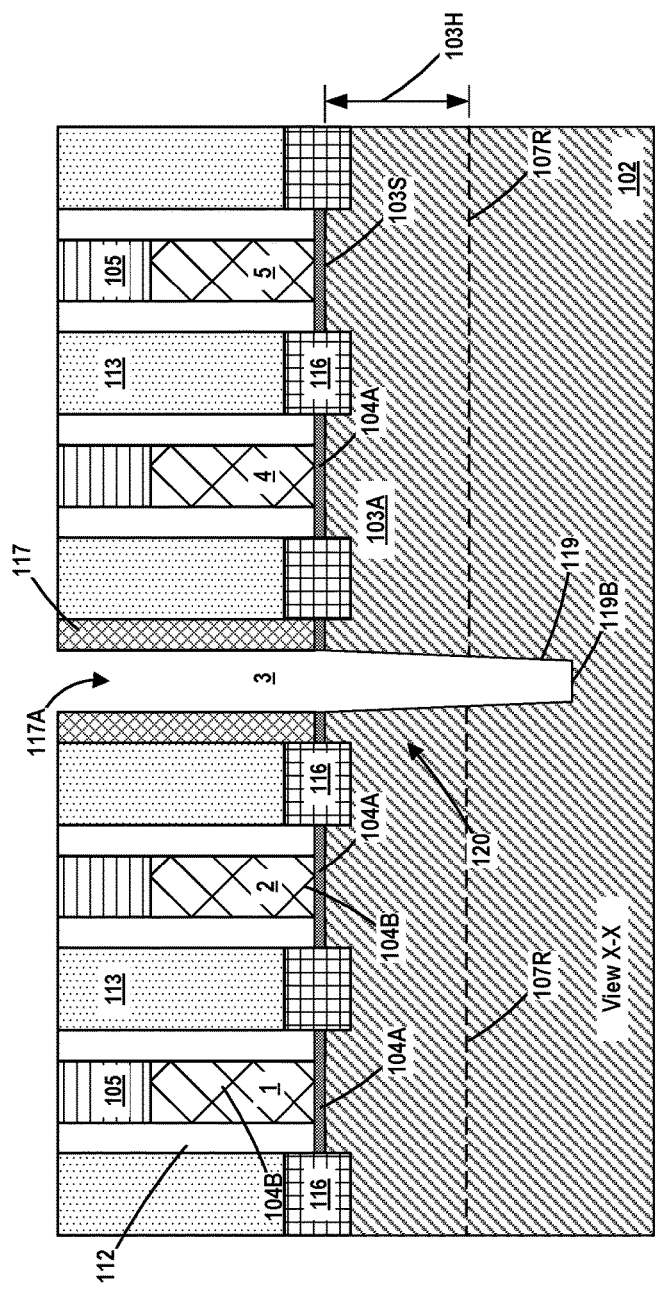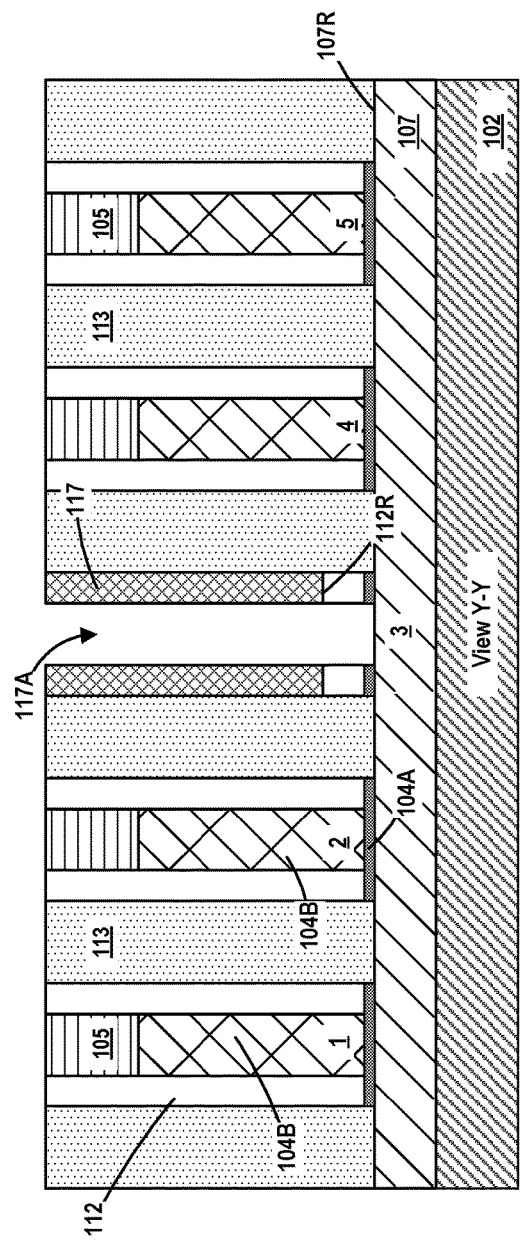

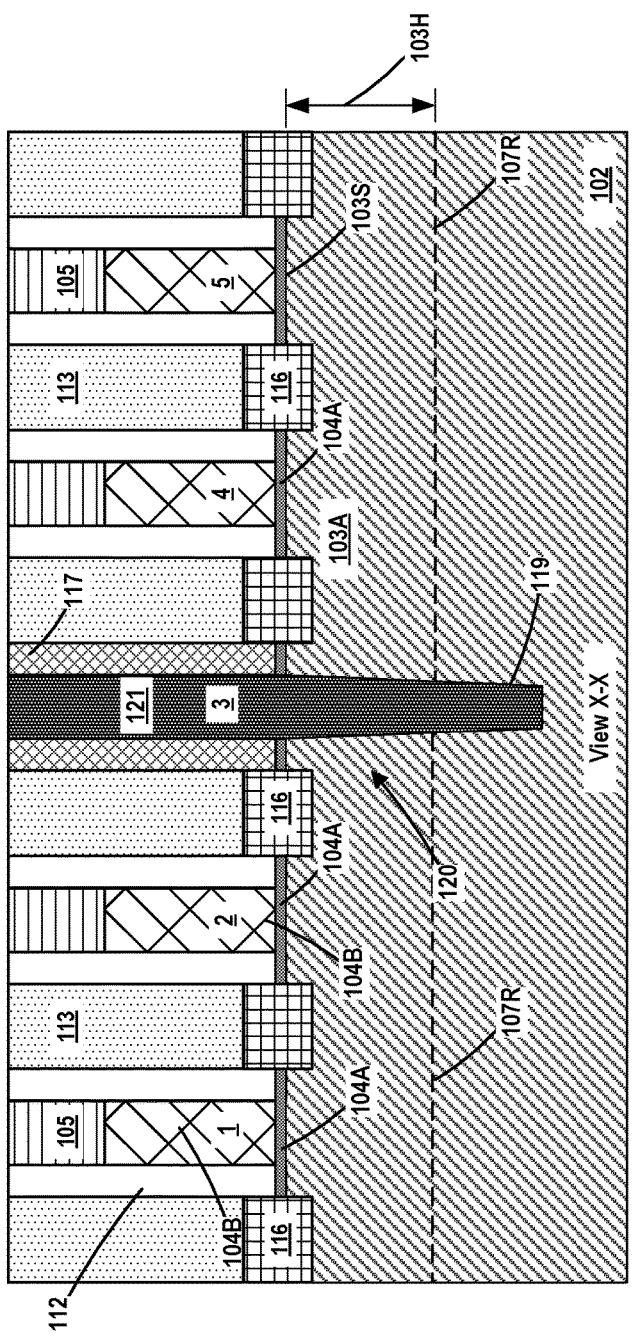
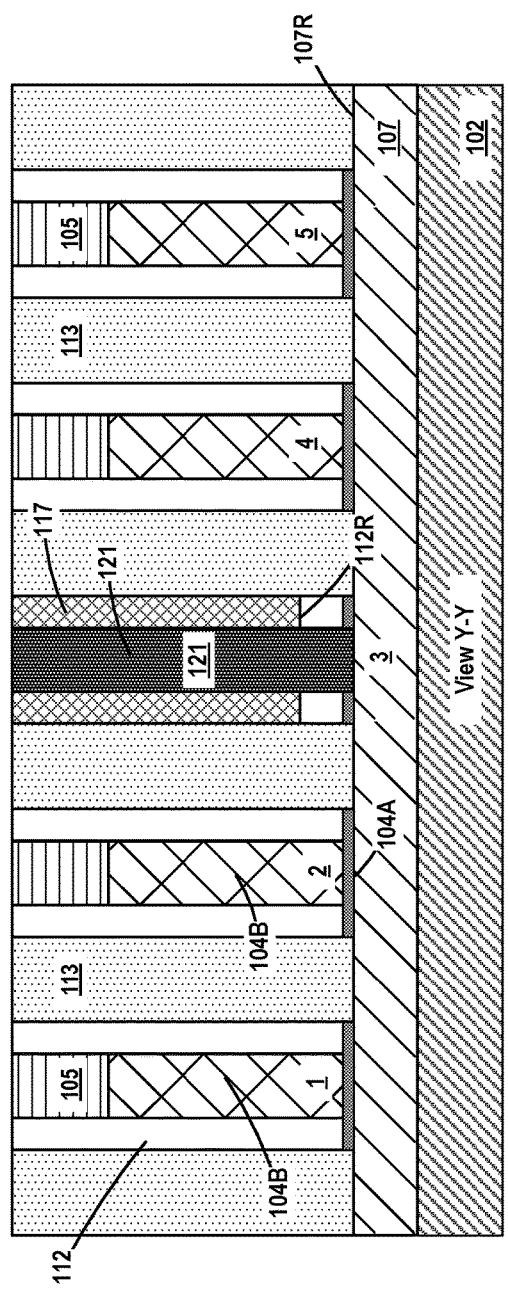

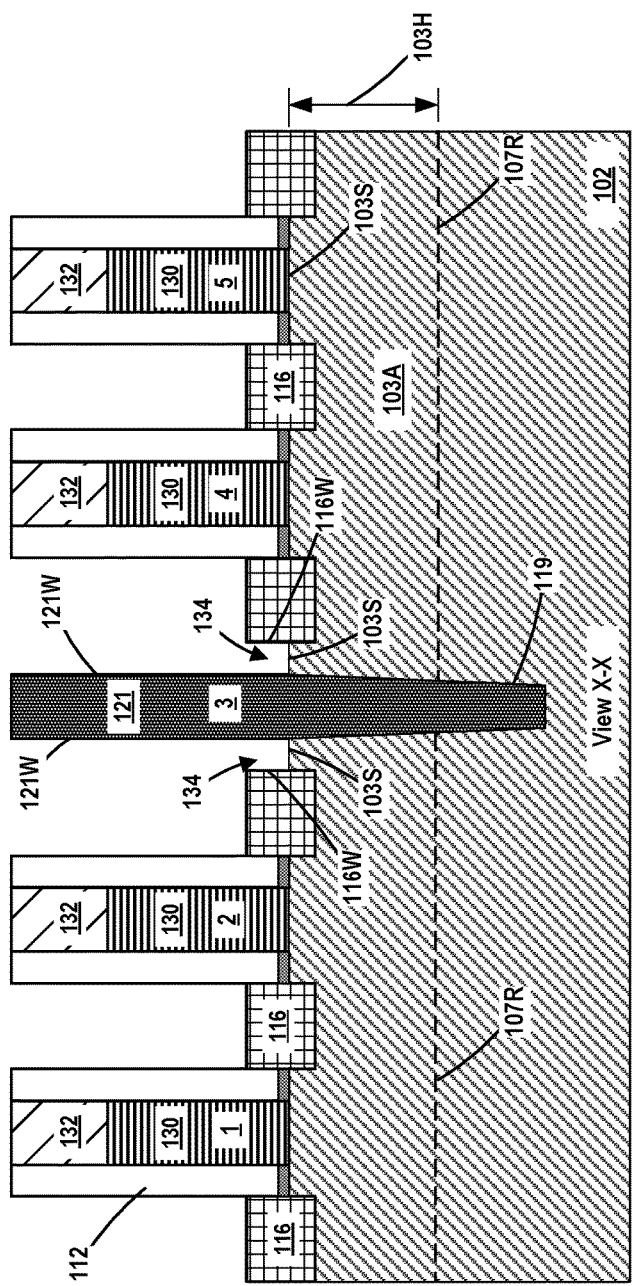
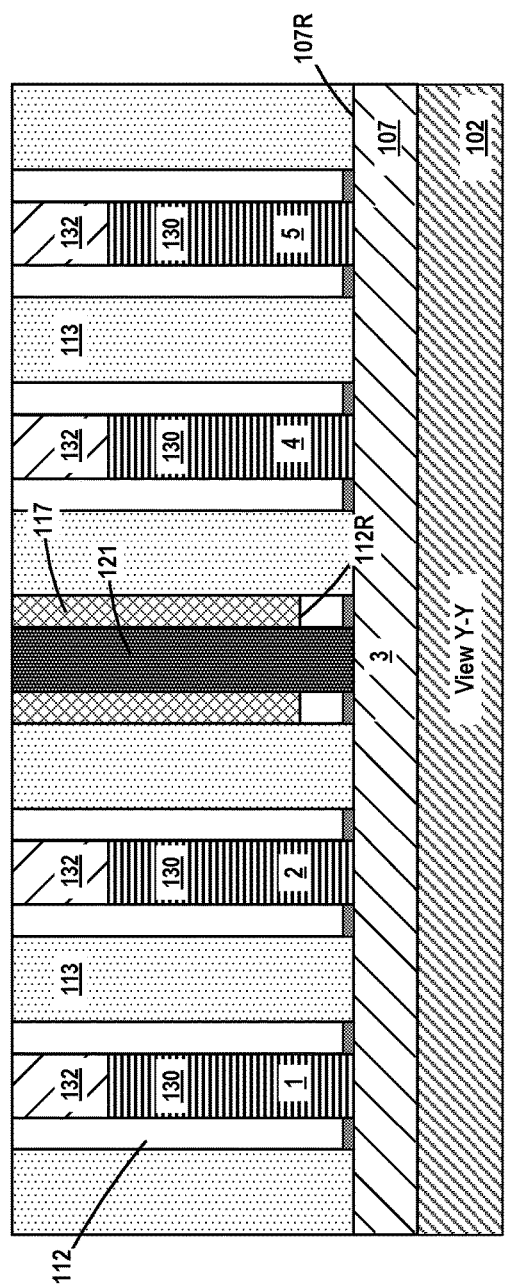

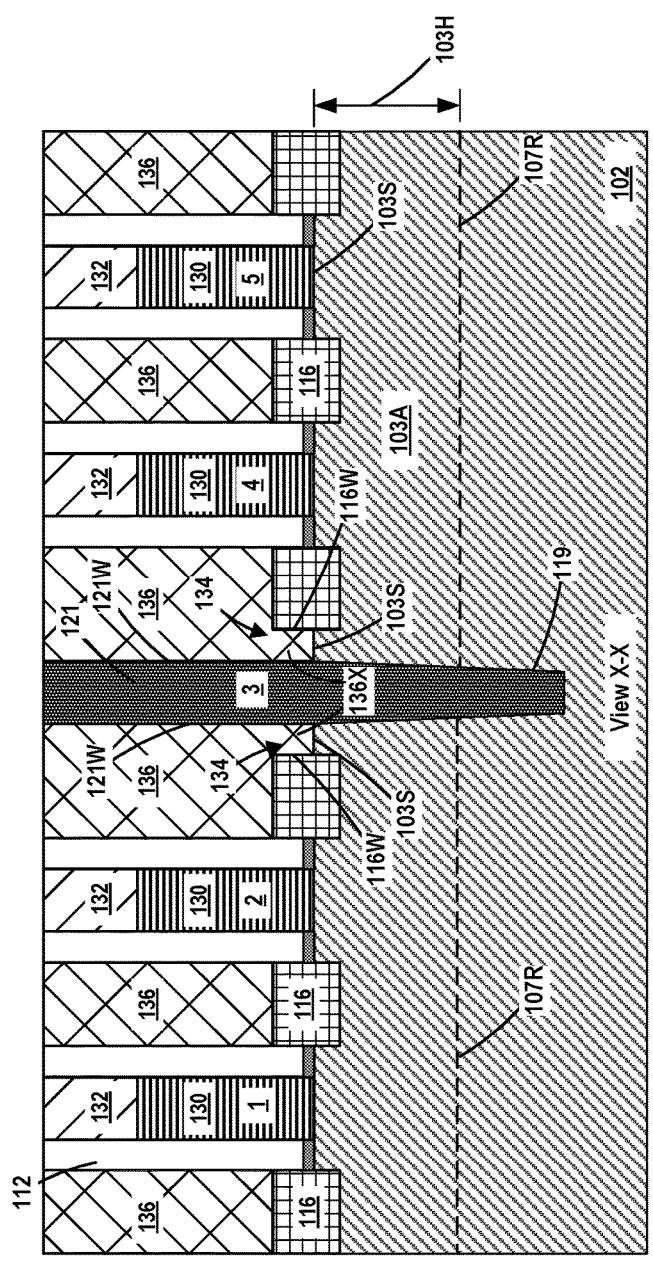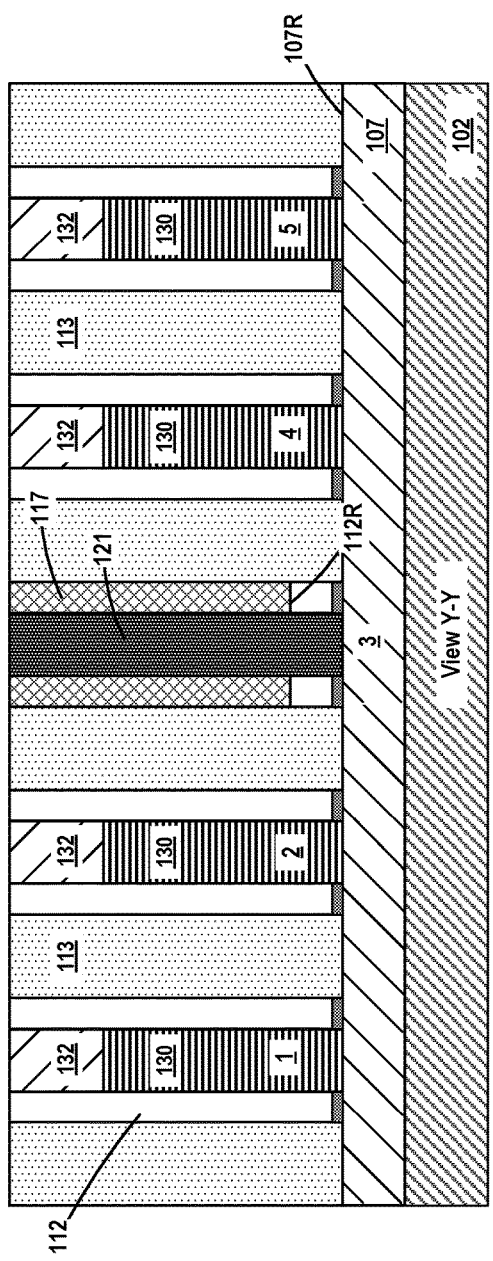

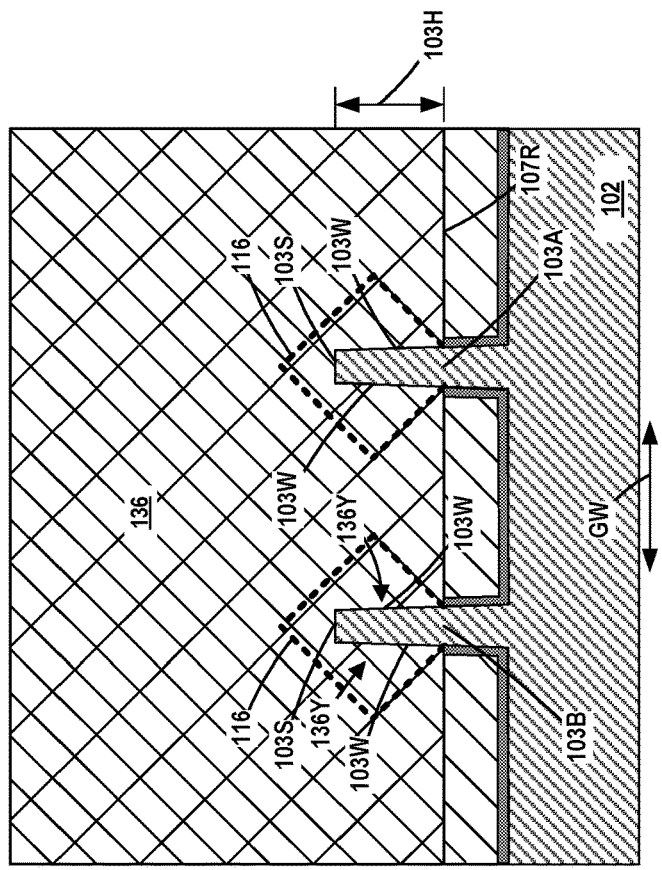
Fig. 29
Fig. 28
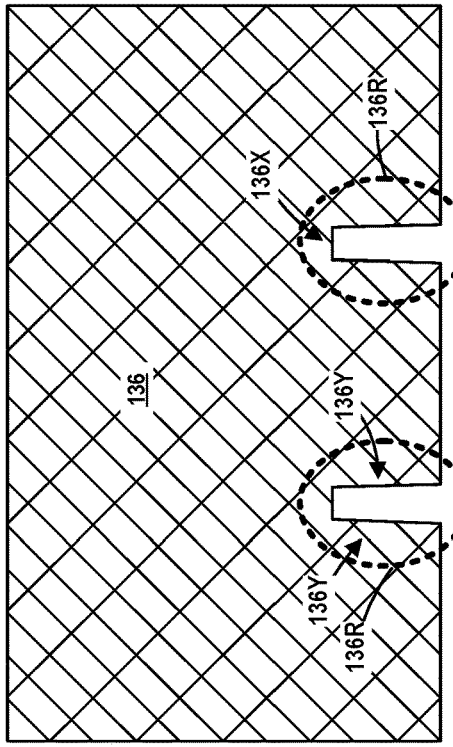
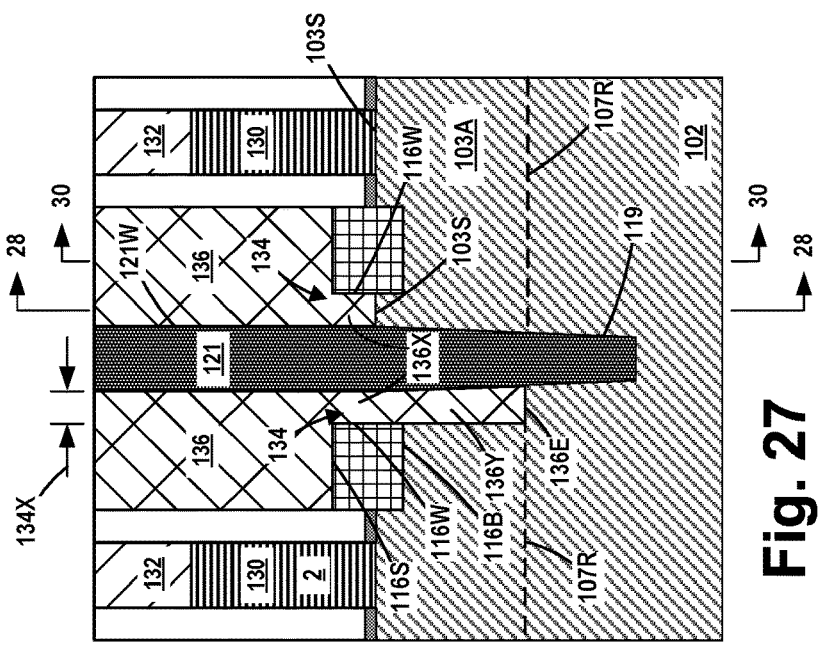
Fig. 27

METHODS OF FORMING SINGLE DIFFUSION BREAKS ON INTEGRATED CIRCUIT PRODUCTS COMPRISED OF FINFET DEVICES AND THE RESULTING PRODUCTS

BACKGROUND

1. Field of the Disclosure

Generally, the present disclosure relates to the manufacture of semiconductor devices, and, more specifically, to various novel methods of forming single diffusion breaks on integrated circuit (IC) products comprised of FinFET devices and the resulting IC products.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices.

The various transistor devices that are formed for an IC product must be electrically isolated from one another to properly function in an electrical circuit. Typically, this is accomplished by forming a trench in the substrate, and filling the trench with an insulating material, such as silicon dioxide. However, the formation of such trenches consumes very valuable plot space on the substrate. Moreover, in some applications, such as those integrated circuit products employing FinFET transistor devices, as device sizes have decreased, and packing densities have increased, it is sometimes difficult to form the desired isolation region made of an insulating material. As a result, in at least some IC products, single break diffusion (SDB) isolation structures are formed to electrically isolate devices from one another. In one illustrative process flow, an SDB isolation structure may be formed by removing a portion of a sacrificial gate structure, etching a trench into the substrate and thereafter filling the opening with an insulating material. Ultimately, conductive source/drain contact structures (e.g., trench silicide structures) will be formed that are conductively coupled to regions of epi semiconductor material formed in the source/drain regions of the transistor device. Unfortunately, when devices are separated by SDB isolation structures, the devices may exhibit performance degradation due to there being limited contact area between the conductive source/drain contact structures and the source/drain regions of the transistor devices.

The present disclosure is directed to methods of forming diffusion breaks on IC products comprised of FinFET devices and the resulting products that may solve or reduce one or more of the problems identified above.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various novel methods of forming single diffusion breaks on IC products comprised of FinFET devices and the resulting products. One illustrative integrated circuit product disclosed herein includes an isolation structure that separates a fin into a first fin portion and a second fin portion, an epi semiconductor material positioned on the first fin portion in a source/drain region of a transistor device, wherein a lateral gap is present between a first sidewall of the epi semiconductor material and a second sidewall of the SDB isolation structure, and a conductive source/drain structure that is conductively coupled to the epi semiconductor material, wherein a gap portion of the conductive source/drain structure is positioned in the gap and physically contacts the first sidewall and the second sidewall.

One illustrative method disclosed herein includes forming a fin in a semiconductor substrate, forming a first sidewall spacer, wherein an interior surface of the sidewall spacer defines an opening that is positioned above the fin, and performing at least one etching process to remove a portion of the fin below the opening and form a trench that extends into the substrate and separates the fin into a first fin portion and a second fin portion, wherein the first fin portion comprises an upper surface and opposing sidewalls and wherein the combination of the opening and the trench define an isolation structure opening. In one example, the method also includes forming an isolation structure within the isolation structure opening, forming an epi semiconductor material on the first fin portion, wherein a sidewall of the epi semiconductor material contacts a sidewall of the first sidewall spacer, removing at least a portion of the first sidewall spacer so as to form a lateral gap between the sidewall of the epi semiconductor material and a sidewall of the isolation structure, and forming a conductive source/drain structure that is conductively coupled to the epi semiconductor material, wherein a gap portion of the conductive source/drain structure is positioned in the gap and physically contacts the sidewall of the epi semiconductor material, the sidewall of the isolation structure and a surface of the fin.

BRIEF DESCRIPTION OF THE DRAWINGS

The disclosure may be understood by reference to the following description taken in conjunction with the accompanying drawings, in which like reference numerals identify like elements, and in which:

FIGS. 1-32 depict various illustrative novel methods disclosed herein for forming single diffusion breaks on IC products comprised of FinFET devices and the resulting products.

Figure 1:
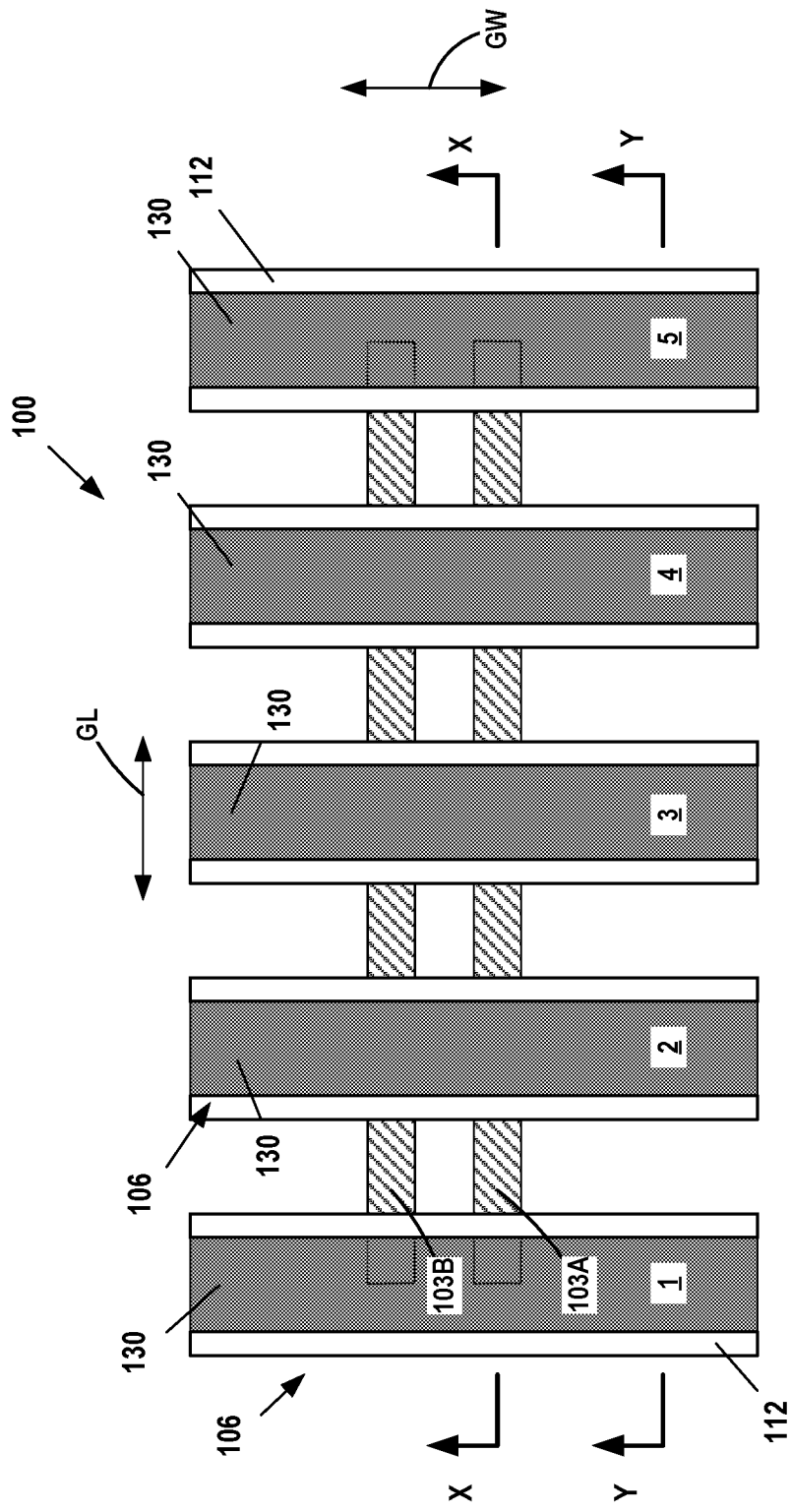

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-32 present various views of illustrative methods of forming a single diffusion break on an integrated circuit product 100 comprised of FinFET devices and the resulting products. FIG. 1 depicts a plurality of fins 103A-B (collectively referenced using the numeral 103) that were formed in a semiconductor substrate 102 (see FIG. 2), as well as a plurality a plurality of gates 106 (numbered 1-5 for ease of reference) that were formed on the IC product 100 for various transistor devices. The depicted transistor device comprises two illustrative fins 103A-B. In practice, the device may comprise one or more fins 103. The operations described below with respect to items formed on or to the fin 103A apply equally to fin 103B, and vice versa. Each of the gates 106 comprise an illustratively depicted final gate structure 130 that will eventually be formed on the product using replacement gate manufacturing techniques. A final gate cap that is positioned above each of the final gate structures 130 is not shown in FIG. 1. Also depicted in FIG. 1 are illustrative sidewall spacers 112 formed adjacent the final gate structures 130.

Still with reference to FIG. 1, various cross-sectional views ("X-X" and "Y-Y") of the product 100 that are depicted in the attached drawings are taken where indicated in FIG. 1. The cross-sectional views X-X and Y-Y are taken in the gate length (GL-current transport) direction of the transistor devices. More specifically, with reference to FIG. 1, the view X-X is a cross-sectional view taken along the long axis (i.e., the axial length) of the fin 103A. The view Y-Y is a cross-sectional view taken through the final gate structures 130 at a location above isolation material 107 (see FIG. 2), e.g., outside of the active region of the transistor devices. The isolation material 107 electrically isolates one transistor device from an adjacent transistor device (not shown). Other views are taken where indicated in the attached drawings.

In the examples depicted herein, the integrated circuit product 100 will be formed in and above a semiconductor substrate 102. The substrate 102 may have a variety of configurations, such as a silicon-on-insulator (SOI) or silicon-germanium-on-insulator (SGOI) that includes a bulk semiconductor layer, a buried insulation layer and an active layer. Alternatively, the substrate may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIGS. 2-3 depict the product 100 after several process operations were performed. More specifically, the fins 103 were formed in the substrate 102 using traditional manufacturing techniques. For example, a patterned fin-formation etch mask (not shown—comprised of, for example, a layer of silicon dioxide and a layer of silicon nitride) was formed above the substrate 102. Thereafter, one or more etching processes, e.g., anisotropic etching processes, were performed through the patterned fin-formation etch mask to form a plurality of fin-formation trenches in the substrate 102 and thereby define the plurality of fins 103. The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques, e.g., depositing the insulating material and thereafter performing a recess etching process. Thereafter, at least portions of the patterned fin-formation etch mask were removed.

The final gate structures 130 for the transistor devices disclosed herein will be manufactured using one illustrative embodiment of a replacement gate (or "gate-last") manufacturing technique. Accordingly, still referencing FIGS.

2-3, after the formation of the fins 103, a plurality of sacrificial (or "dummy") gate structures 104, with a sacrificial gate cap 105 formed there above, were formed across the substrate 102. In one illustrative and non-limiting process flow, each of the sacrificial structures 104 comprises a sacrificial gate insulation layer 104A (e.g., silicon dioxide) and a sacrificial gate electrode material 104B (e.g., polysilicon or amorphous silicon). In the depicted example, the sacrificial gate insulation layer 104A was formed by performing a conformal deposition process. In other embodiments, the sacrificial gate insulation layer 104A may be formed by performing a thermal growth process. A sacrificial gate cap 105 (e.g., silicon nitride) is positioned above each of the sacrificial gate structures 104. In one illustrative process flow, the sacrificial gate structures 104 (with the gate cap 105 there above) are initially formed as continuous line-type structures that extend across substantially the entire substrate 102, including across both active regions and isolation regions located between active regions. The long continuous line-type sacrificial gate 104/gate cap 105 structures may be formed by depositing the materials for the sacrificial gate structures 104 as well as a layer of material for the sacrificial gate caps 105 across the entire substrate 102, forming a patterned gate etch mask (not shown) above the deposited layer of the material for the sacrificial gate caps 105, and performing one or more etching processes through the patterned gate etch mask to remove the exposed portions of sacrificial gate cap material and, thereafter, the exposed portions of the sacrificial gate materials.

Next, still referencing FIGS. 2-3, a sidewall spacer structure 112 (e.g., silicon nitride, a low-k material (k value of 3.3 or less), etc.) was formed adjacent the long continuous line-type sacrificial gate structures 104 and gate caps 105. The spacer 112 may be formed by depositing a conformal layer of spacer material and thereafter performing an anisotropic etching process. Various process operations are typically performed with the sacrificial gate structures 104, gate caps 105 and spacers 112 in position, e.g., source/drain implantation processes, the formation of epi semiconductor material 116 in the source/drain regions of the transistor devices, etc. Then, a conformal contact etch stop layer (not shown, e.g., silicon nitride) was formed on the product 100 and above the epi semiconductor material 116. At that point, a layer of insulating material 113 (e.g., silicon dioxide) was blanket-deposited across the product 100 so as to over-fill the open spaces between the spacers 112. Thereafter, a CMP and/or etch-back process was performed to planarize the upper surface of the layer of insulating material 113 with the upper surface of the sacrificial gate caps 105. In one illustrative process flow, the materials of the sacrificial gate caps 105, the spacers 112 and the insulating material 113 are comprised of materials that permit these structures to be selectively etched relative to one another. In one illustrative example, the sacrificial gate caps 105 may be comprised of silicon nitride, the spacers 112 may be comprised of silicon nitride, SiNC, etc. and the insulating material 113 may be silicon dioxide.

FIGS. 4-5 depict the product 100 after a patterned etch mask 115, e.g., a patterned OPL layer or photoresist, was formed on the product 100 by performing traditional manufacturing techniques. The patterned etch mask 115 comprises an opening 115A located above gate 3 and the adjacent spacers 112 and gate cap 105. As described more fully below, the opening 115A is positioned at a location wherein is it desired to remove a portion of the axial length (in the gate width direction of the devices) of the sacrificial gate structure 104 of gate 3 and thereafter form an isolating single diffusion break (SDB) structure 121 in its place.

Figure 6:
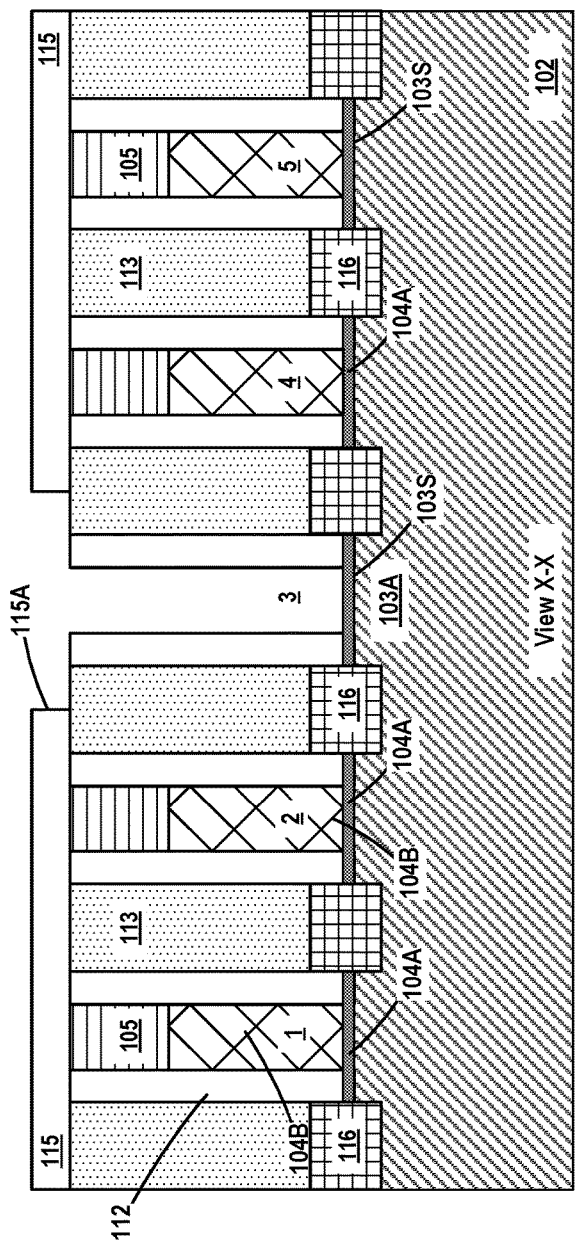
Figure 7:
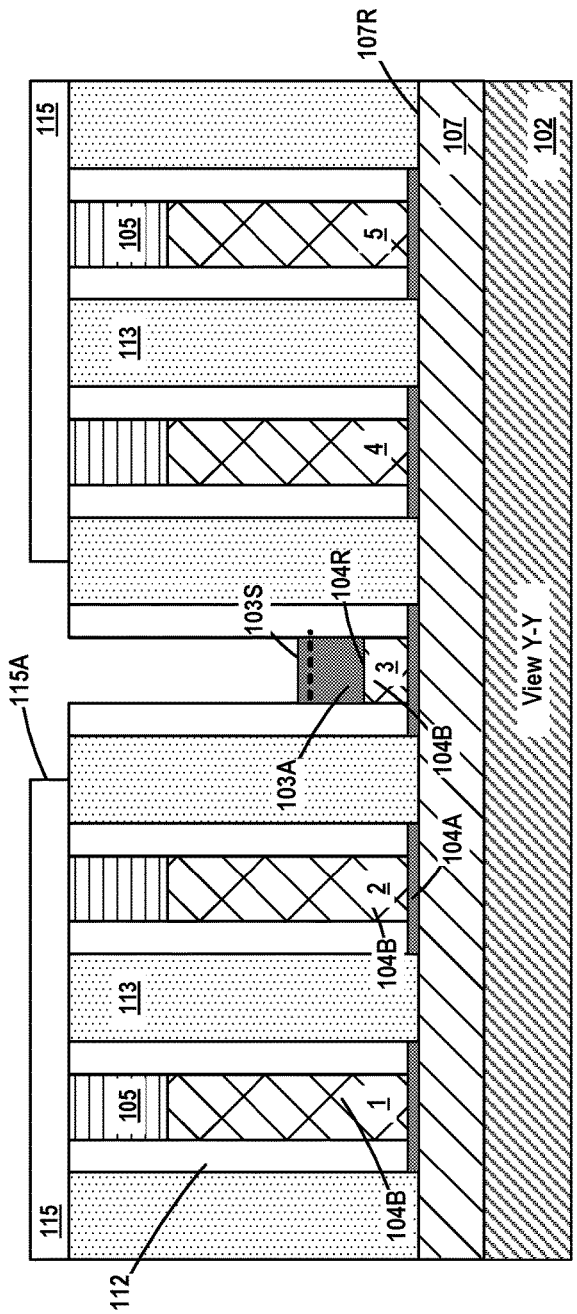

FIGS. 6-7 depict the product 100 after several process operations were performed. First, an etching process was performed to remove a portion of the axial length (in the gate width direction of the devices) of the sacrificial gate cap 105 of gate 3 above the fin 103A relative to the surrounding materials. The amount of the axial length of the sacrificial gate cap 105 removed corresponds approximately to the size of the opening 115 in the gate width direction (i.e., into and out of the plane of the drawing page) of the devices. The process operation exposes a portion of the axial length of the sacrificial gate structure 104 of gate 3. Next, a recess etching processes was performed to remove portions of the vertical height of the sacrificial gate electrode 104B of the sacrificial gate structure 104 of gate 3 relative to the surrounding materials. As shown in FIG. 7, the remaining portions of the sacrificial gate electrode 104B have a recessed upper surface 104R. Note that, as shown in FIG. 6, this process operation clears the material of the sacrificial gate electrode 104B located above the upper surface 103S of the fin 103A. The amount of recessing of the sacrificial gate electrode 104B may vary depending upon the particular application. In general, the sacrificial gate electrode 104B may be recessed such that the recessed surface 104R is positioned at a level that is below the level of the upper surface 103S of the fin 103A. In one illustrative embodiment, the distance between the recessed surface 104R the upper surface 103S of the fin 103A may be about 5-40 nm.

Figure 8:
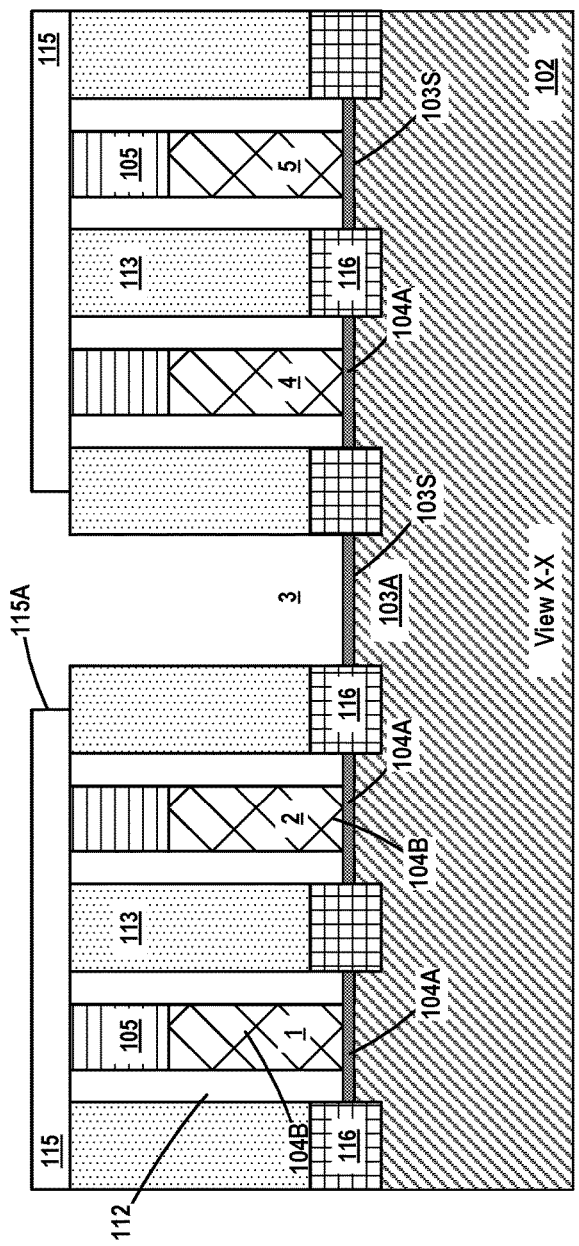
Figure 9:
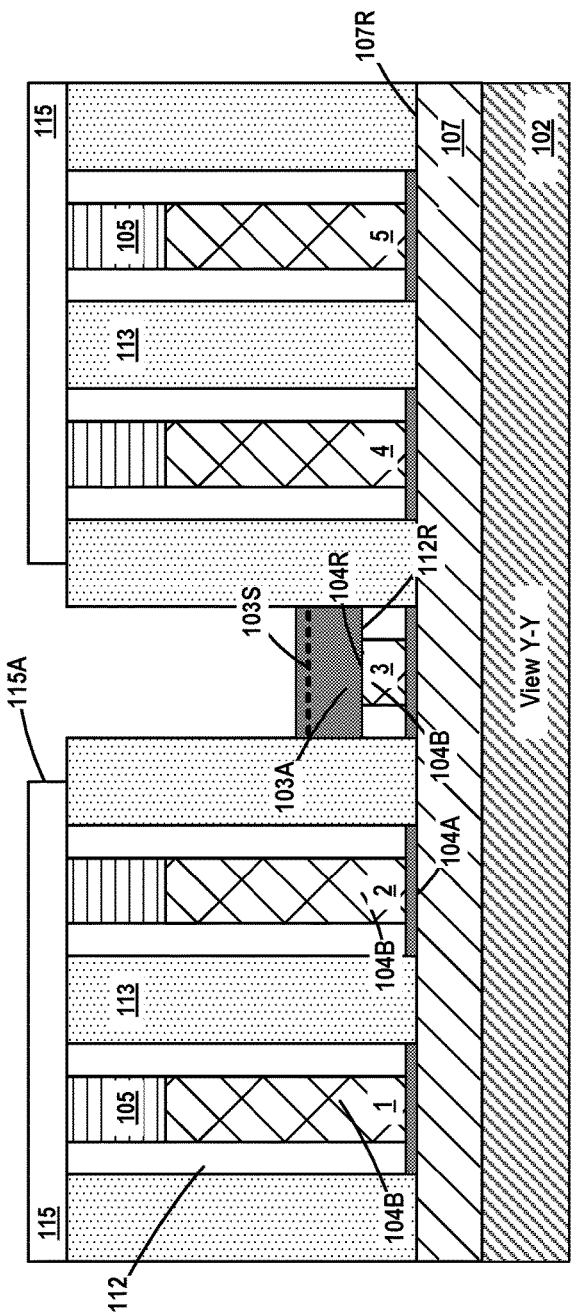

FIGS. 8-9 depict the product 100 after a recess etching processes was performed to remove portions of the vertical height of the spacers 112 relative to the surrounding materials. As shown in FIG. 9, the remaining portions of the spacers 112 have a recessed upper surface 112R. Note that, as shown in FIG. 8, this process operation clears the material of the spacers 112 located above the upper surface 103S of the fin 103A. The amount of recessing of the spacers 112 may vary depending upon the particular application. In general, the spacers 112 may be recessed such that the recessed surface 112R is positioned at a level that is below the level of the upper surface 103S of the fin 103A. In one illustrative embodiment, the distance between the recessed surface 112R and the upper surface 103S of the fin 103A may be about 5-30 nm.

FIGS. 10-11 depict the product 100 after an etching process was performed to remove the remaining portions of the sacrificial gate electrode materials 104B relative to the surrounding materials.

Figure 12:
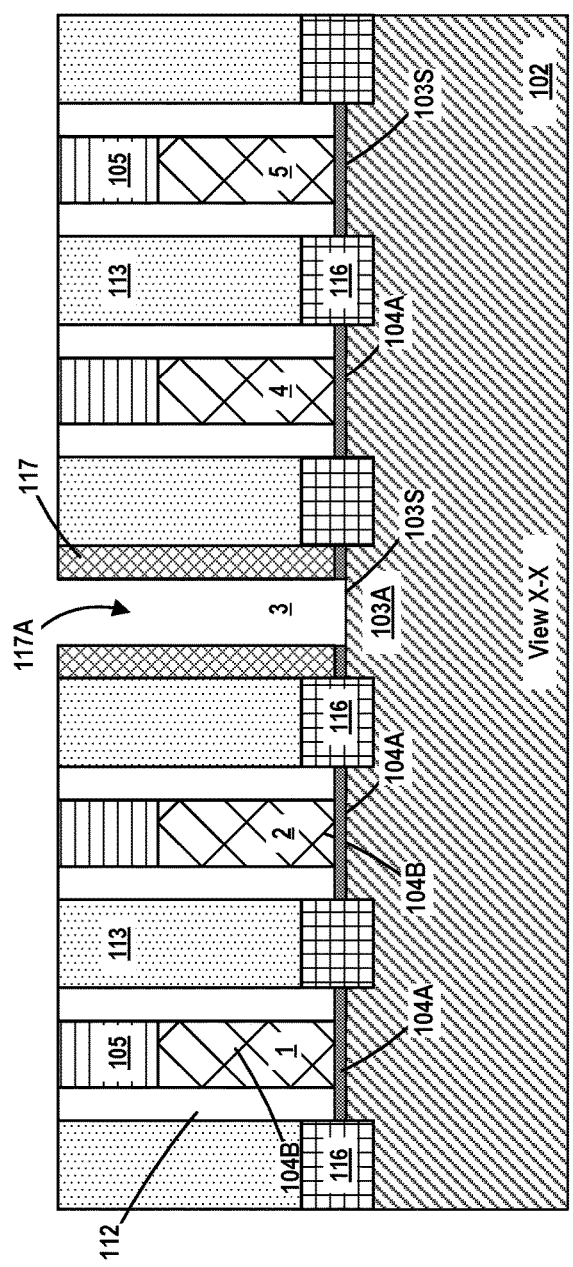
Figure 13:
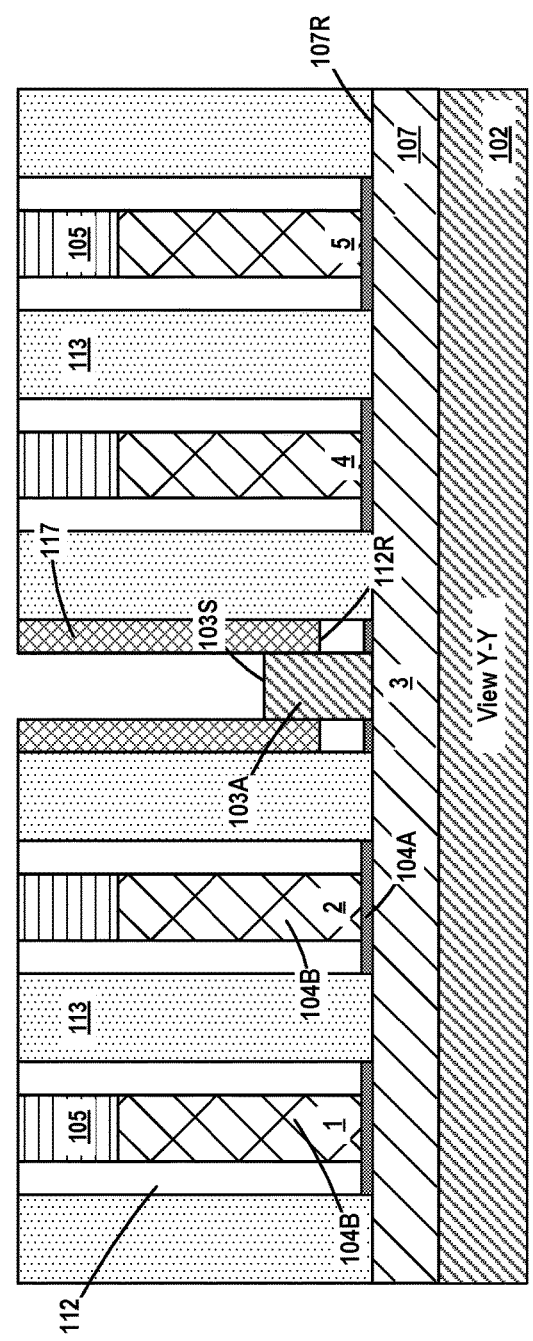

FIGS. 12-13 depict the product 100 after an internal sidewall 117 (e.g., silicon dioxide, etc.) was formed in the space previously occupied by the removed portions of spacer 112. The interior surface of the internal sidewall spacer 117 defines an opening 117A. In one illustrative example, this process operation exposes a portion of the axial length of the fin 103A positioned below the opening 117A and exposes at least the upper surface 103S of the fin 103A.

FIGS. 14-15 depict the product 100 after a selective etching process was performed to remove exposed portions of the fins 103A/B within the opening 117A relative to the surrounding materials. This process operation results in the formation of a plurality of trenches 119 (one of which is shown in FIG. 14) that extends downward into the substrate 102. A trench 119 that extends downward into the substrate 102 will be formed in the area of each of the fins 103A, 103B. In the depicted example, the combination of the opening 117A and the trenches 119 define an isolation structure opening 120. The depth of the trenches 119 may vary depending upon the particular application. In one illustrative example, the bottom 119B of the trenches 119 extends to a depth that is below the level of the recessed surface 107R of the insulating material 107. In one illustrative example, the distance between the recessed surface 107R and the bottom 119B of the trenches 119 may be about 10-20 nm. The exposed height 103H of the fins 103 above the recessed upper surface 107R of the isolation material 107 is also depicted in FIG. 14. The absolute magnitude of the exposed height 103H of the fins 103 may vary depending upon the particular application. Note that this process operation effectively cuts the fin 103A into a first fin portion (to the left of the trench 119) and a second fin portion (to the right of the trench 119).

FIGS. 16-17 depict the product 100 after an SDB isolation structure 121 was formed in the isolation structure opening 120, e.g., in the opening 117A defined by the internal sidewall spacer 117 and in the trenches 119. The SDB isolation structure 121 may be comprised of a variety of different materials (e.g., SiN, SiNC, SiCOH, SiC, etc.). The SDB isolation structure 121 may be formed by blanket-depositing the material for the SDB isolation structure 121 across the product 100 so as to over-fill the trenches 119 and the opening 117A, and thereafter performing a CMP and/or etch-back process to remove excess amounts of the material for the SDB isolation structure 121 positioned outside of the opening 117A.

Figure 18:
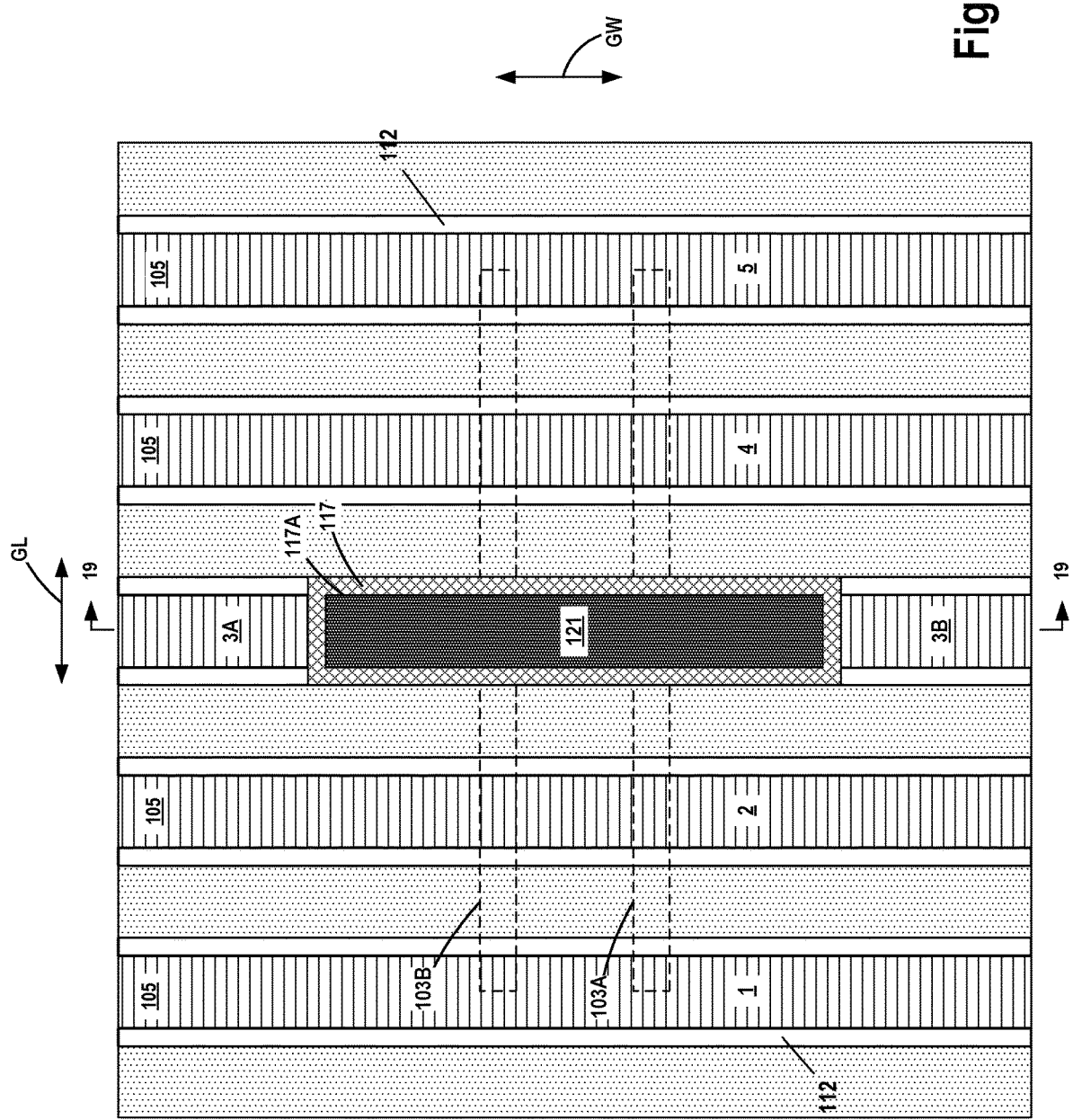
Figure 19:
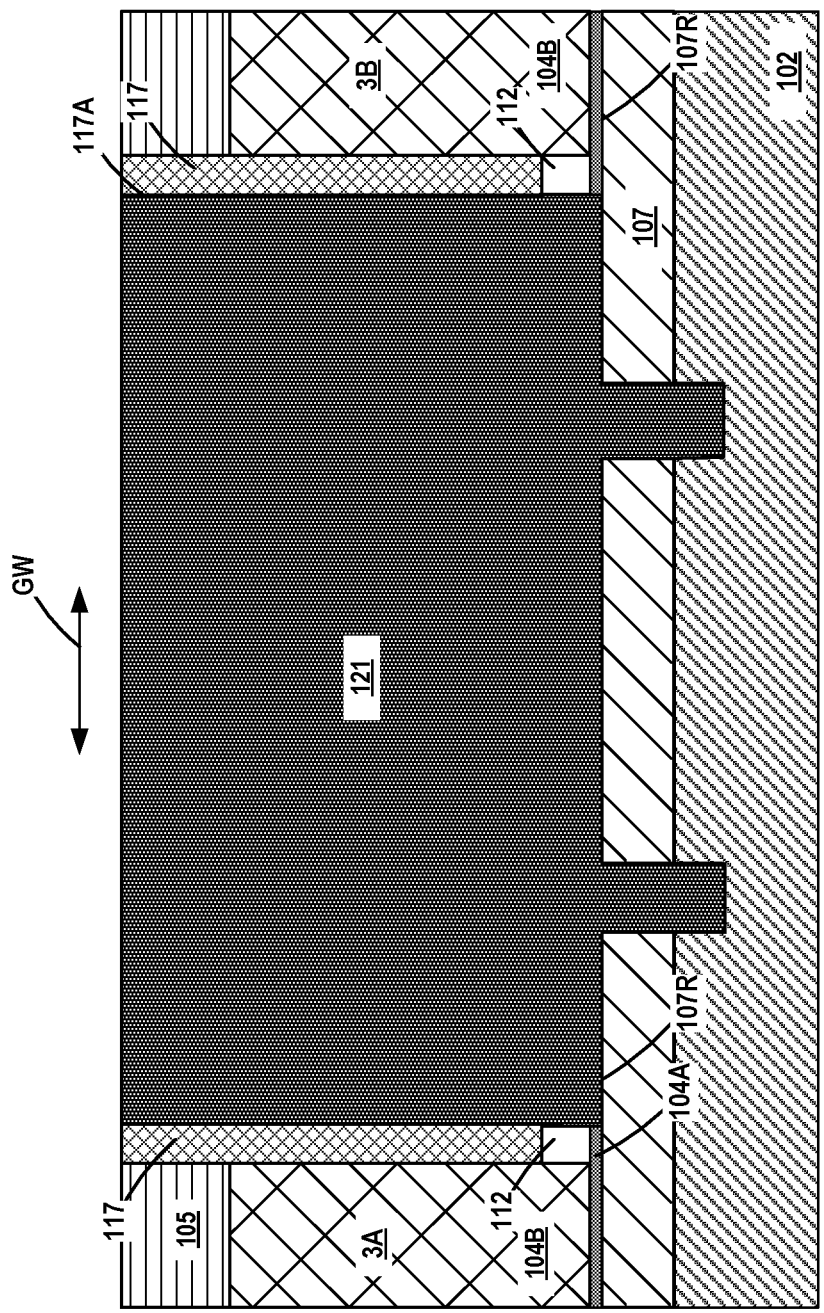

FIG. 18 is a plan view of the product 100 after the formation of the SDB isolation structure 121. FIG. 19 is a cross-sectional view taken where indicated in FIG. 18—through the SDB isolation structure 121 in the gate width (GW) direction of the transistor device. As indicated, the SDB isolation structure 121 (and the internal sidewall spacer 117) essentially separate the initial sacrificial gate structure 104 of gate 3 into axially separate sacrificial gate structures 3A and 3B.

Figure 20:
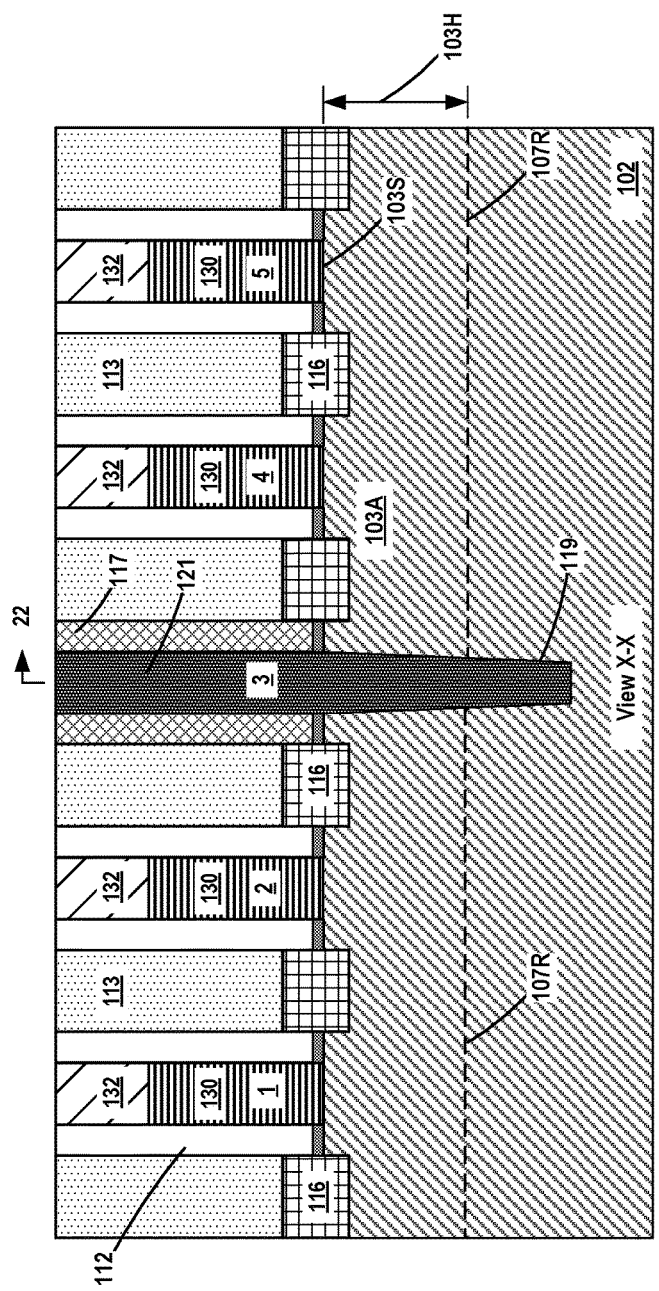
Figure 21:
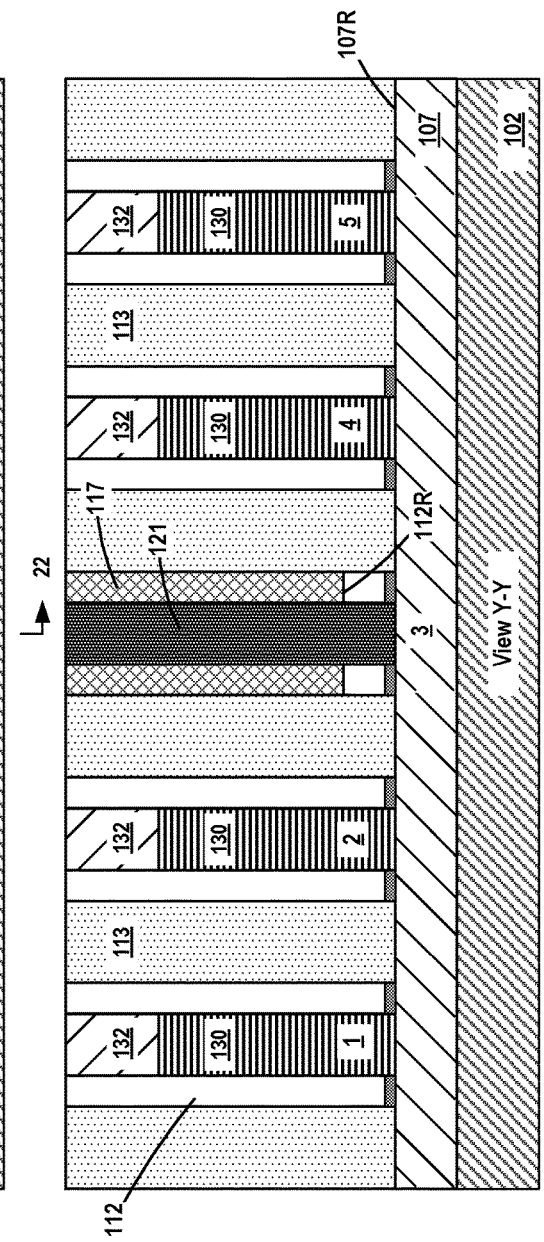
Figure 22:
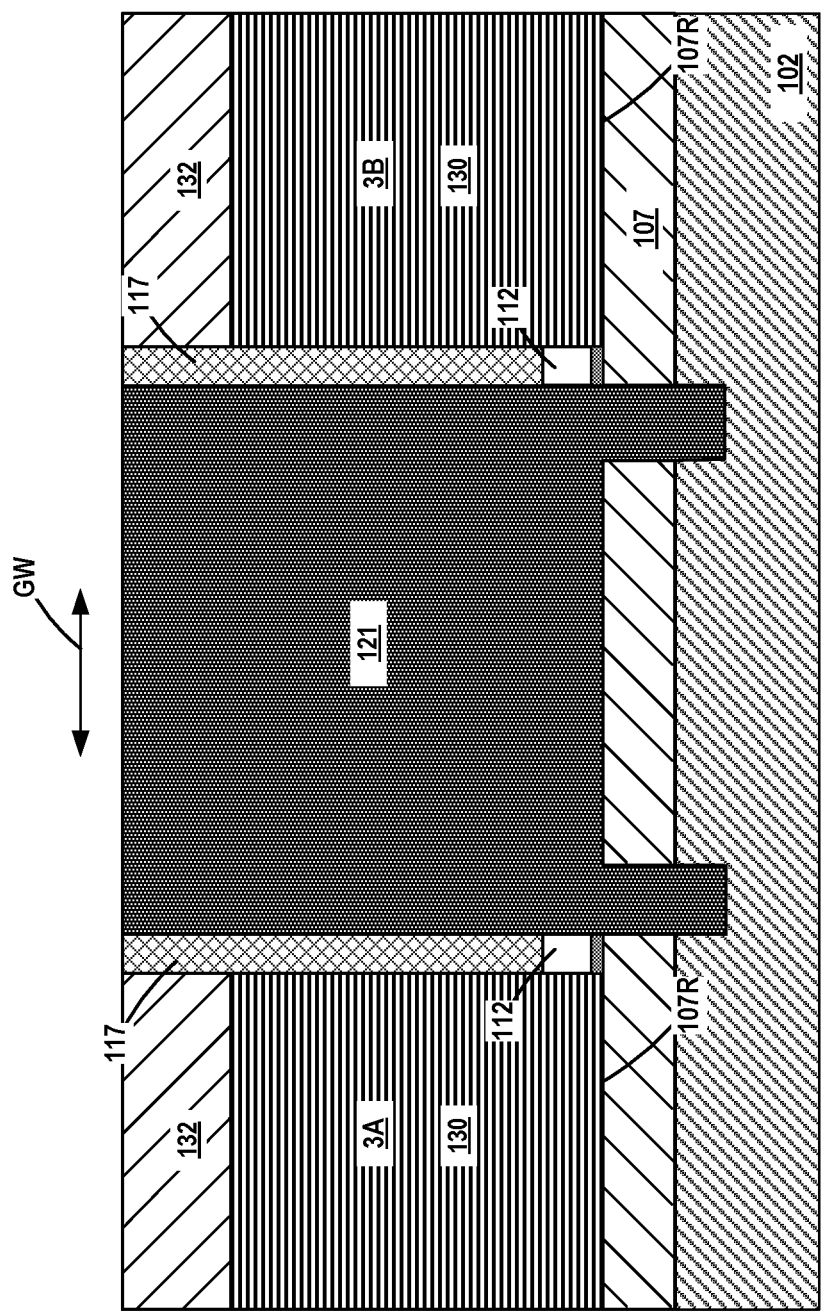

As noted above, the final gate structures 130 for the transistor devices disclosed herein will be manufactured using one illustrative embodiment of a replacement gate (or "gate-last") manufacturing technique. Accordingly, FIGS. 20-21, depict the product 100 after several process operations were performed. More specifically, one or more etching processes were performed to remove the sacrificial gate caps 105 selectively relative to the surrounding materials. This process operation exposes the underlying sacrificial gate structures 104. At that point, the sacrificial gate structures 104 were removed so as to form a plurality of replacement gate cavities located laterally between the spacers 112. Thereafter, in one illustrative process flow, the materials for the final gate structures 130 were formed in the replacement gate cavities. The final gate structures 130 depicted herein are intended to be representative in nature of any type of replacement gate structure that may be employed in manufacturing integrated circuit products. For example, the final gate structures 130 may comprise a high-k gate insulation layer (not separately shown), such as hafnium oxide, a material having a dielectric constant greater than 10, etc., and one or more conductive work-function adjusting metal layers (not separately shown), e.g., titanium, tantalum, titanium nitride, tantalum nitride, titanium carbide, etc., as well as one or more bulk conductive layers of material (e.g., titanium, tungsten, aluminum, etc.) Then, a CMP and or etch-back process was performed to remove excess amounts of the materials of the final gate structures 130 that were positioned outside of the replacement gate cavities. At that point, one or more recess etching processes were performed to reduce the height or recess the materials (e.g., the high-k gate insulation layer and the conductive materials of the final gate structures 130) within the replacement gate cavities. This process operation results in the formation of a cavity above each of the recessed final gate structures 130 and between the spacers 112. The amount of recessing of the materials of the final gate structures 130 may vary depending upon the particular application. Thereafter, final gate cap structures 132 were formed in the cavities above the recessed final gate structures 130. The final gate cap structures 132 may be comprised of a material such as silicon nitride. The final gate cap structures 132 may be formed by blanket-depositing the material for the final gate cap structures 132 across the product 100 and in the cavities above the recessed final gate structures 130, and thereafter performing a CMP and/or etch-back process to remove excess amounts of the gate cap material positioned outside of the cavities using the insulating material 113 and the spacers 112 as polish-stops. FIG. 22 is a cross-sectional view taken where indicated in FIG. 20—through the SDB isolation structure 121 in the gate width (GW) direction of the transistor device after the formation of the final gate structures 130 and final gate caps 132.

FIGS. 23-24 depict the product 100 after several process operations were performed to prepare for formation of source/drain metallization structures—conductive source/drain structures 136 (see FIG. 25)—that are conductively coupled to the epi material 116 in the source/drain regions of the devices. In one illustrative process flow, a patterned etch mask (not shown), e.g., a patterned OPL layer or photoresist, was formed on the product 100. The patterned etch mask comprises a plurality of openings at locations wherein it is desired to remove portions of the internal sidewall spacer 117 as well as the insulating material 113 selectively relative to surrounding materials so as to thereby expose the regions of epi material 116. One or more etching processes were then performed through the patterned etch mask to remove the exposed portions of the internal sidewall spacer 117 as well as the insulating material 113. Thereafter, the patterned etch mask was removed. Note that, in this depicted process flow, the insulating material 113 is not removed from above the isolation material 107 shown in FIG. 24 (view Y-Y). Removal of the spacers 117 adjacent the SDB isolation structure 121 effectively exposes the sidewalls 121W of the SDB isolation structure 121 and the sidewall 116W of the epi semiconductor material positioned immediately adjacent the SDB isolation structure 121. In one illustrative process flow, this process operation also results in the removal of the exposed portions of the sacrificial gate insulating layer 104A so as to thereby expose the upper surface 103S (and sidewalls) of the fins 103. As depicted, theses process operations results in the formation of a gap 134 between the SDB isolation structure 121 and each immediately adjacent region of epi material 116. The lateral width 134X (see FIG. 27) of the gap 134 (in the gate length direction) corresponds approximately to the lateral width of the internal sidewall spacer 117. As indicated, a portion of the gap 134 above the upper surface 103S of the fins is laterally bounded (in the gate length direction) by a sidewall 116W of the epi material 116 and a sidewall 121W of the SDB isolation structure 121. The bottom of an upper portion of the gap 134 is defined by the upper surface 103S of the fin.

FIGS. 25-26 depict the product 100 after various process operations were performed to form illustrative conductive source/drain structures 136 (e.g., trench silicide structures) that are conductively coupled to the epi semiconductor material 116 in the source/drain regions of the transistor devices (and in other areas where the insulating material 113 was removed). In the depicted example, the conductive source/drain structures 136 extend across substantially the entire active region of the devices in the gate width (GW) direction of the transistor devices (into and out of the plane of the drawing page in FIG. 25). Although not shown in the drawings, depending upon the particular application, one or more of the conductive source/drain structures 136 may extend across the isolation material 107 shown in FIG. 26 to another transistor device (not shown) on the product. In one illustrative embodiment, the conductive source/drain structures 136 may comprise a variety of different conductive materials, e.g., tungsten, cobalt, aluminum, a metal, a metal compound, cobalt silicide, nickel silicide, titanium silicide, nickel platinum silicide, etc. In one illustrative process flow, the material(s) for the conductive source/drain structures 136 was formed above the product 100 so as to over-fill the source/drain contact openings formed by removal of the internal sidewall spacer 117 and the insulating material 113. At that point, one or more CMP and/or etch-back processes were performed to planarize the upper surface of the product 100 and remove excess amounts of the material(s) for the conductive source/drain structures 136 that was positioned outside of the source/drain contact openings.

Figure 30:
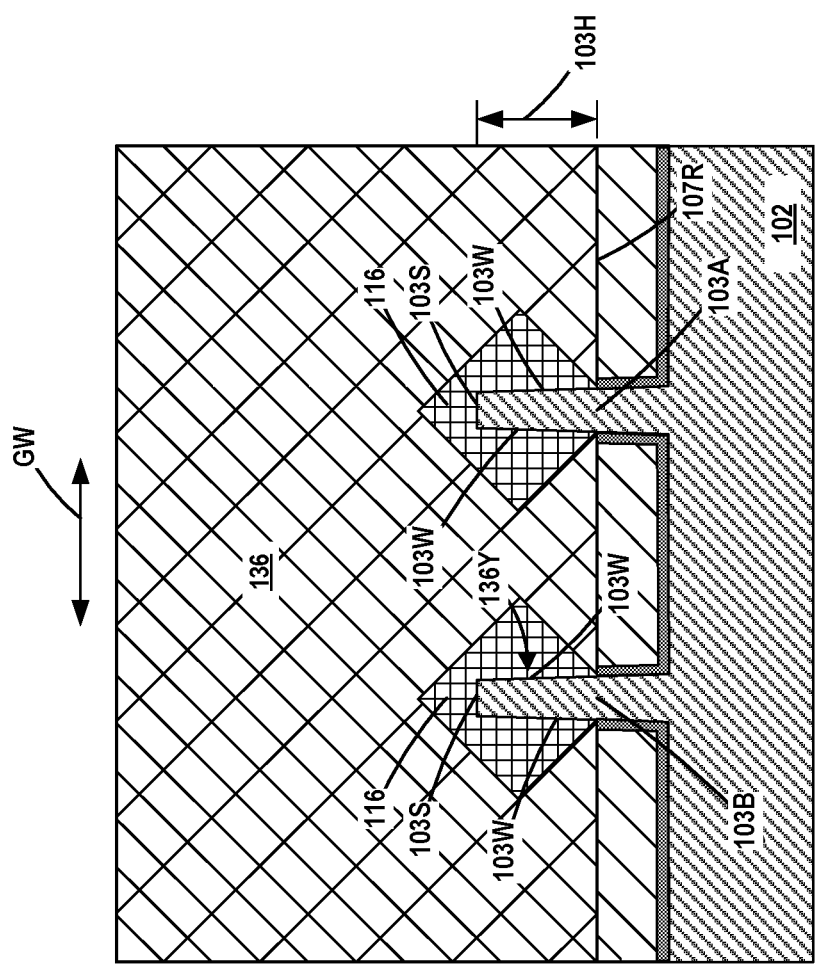

FIG. 27 is a view of the portions of the product 100 located immediately adjacent the SDB isolation structure 121. FIG. 28 is a cross-sectional view taken where indicated in FIG. 27—through one of the gaps 134 in the gate width (GW) direction and across both of the fins 103. As noted above, the gaps 134 have a lateral width 134X in the gate length direction of the devices. As indicated in FIG. 27, part of a gap portion 136X of the conductive source/drain structure 136 is positioned in the gap 134 between the sidewall 121W and the sidewall 116W of the epi region 116. In the depicted example, the gap portion 136X physically contacts the upper surface 103S of the fin 103 as well as the sidewalls 121W and 116W. A downward extending portion 136Y of the gap portion 136X of the conductive source/drain structure 136 is shown on the left side of the SDB isolation structure 121 in FIG. 27—note this is not a true cross-sectional view but it is provided to explain aspects of the subject matter disclosed herein. In practice, to the extent practical, the conductive source/drain structure 136 is a unitary structure (that includes the gap portion 136X) that wraps around the epi material 116, the upper surface 103S of the fin 103A and the sidewalls 103W of the fin 103A. The gap portion 136X and part of its downward extending portions 136Y is shown only as a separate structure in FIG. 27 for purposes of explanation and discussion. As best seen in FIG. 28, the downward extending portion 136Y extends downward through the gap 134 and contacts both of the opposing sidewalls 103W of the fin 103 and stops on the isolation material 107. This downward extending portion 136Y contacts the sidewall 121W of the SDB isolation structure 121 for substantially the entire distance from the upper surface 116S of the epi material 116 to the upper surface 107R of the isolation material. The downward extending portions 136Y also extend downward past the bottom 116B of the region of epi material 116. Note that the upper part of the gap portion 136X contacts and engages both of the sidewalls 103W of the fin 103, the sidewall 116W, the sidewall 121W and the upper surface 103S of the fin 103A. In one illustrative embodiment, the end surface 136E (see FIG. 27) of the downward extending portion 136Y positioned under the gap 134 abuts and engages the recessed upper surface 107R of the isolation material 107. In FIG. 28, the outline of the epi material 116 is shown in dashed lines. In this example, the epi material 116 has an approximate rhombus-like outline or shape due to the crystallographic orientation of the material of the fins 103. FIG. 29 is a view of the conductive source/drain structure 136 shown in FIG. 28 with the other structures removed. As indicated, since the conductive source/drain structure 136 is formed in the gap 134 between the epi material 116 and the SDB isolation structure 121 and around the exposed portions of the fin 103A, the gap portion 136X of the conductive source/drain structure 136 has a generally inverted U-shaped configuration, as reflected in the dashed lines 136R in FIG. 29 (when viewed in a cross-section taken through the portion of the conductive source/drain structure 136 located in and vertically below the gap 134, in the gate width direction of the devices). FIG. 30 is a cross-sectional view taken where indicated in FIG. 27—through the epi material 116 to the right of the SDB isolation structure 121 in the gate width (GW) direction and across both of the fins 103. The fins 103 have been depicted as being distinct from the epi material 116 in FIG. 30 for purposes of explanation of the subject matter disclosed herein.

Figure 31:
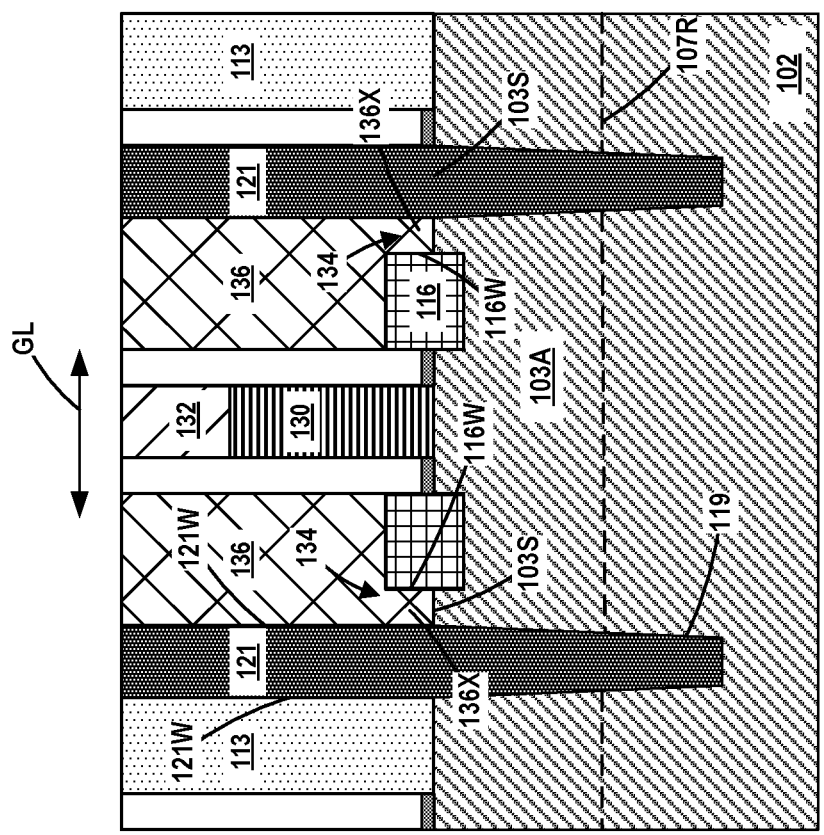
Figure 32:
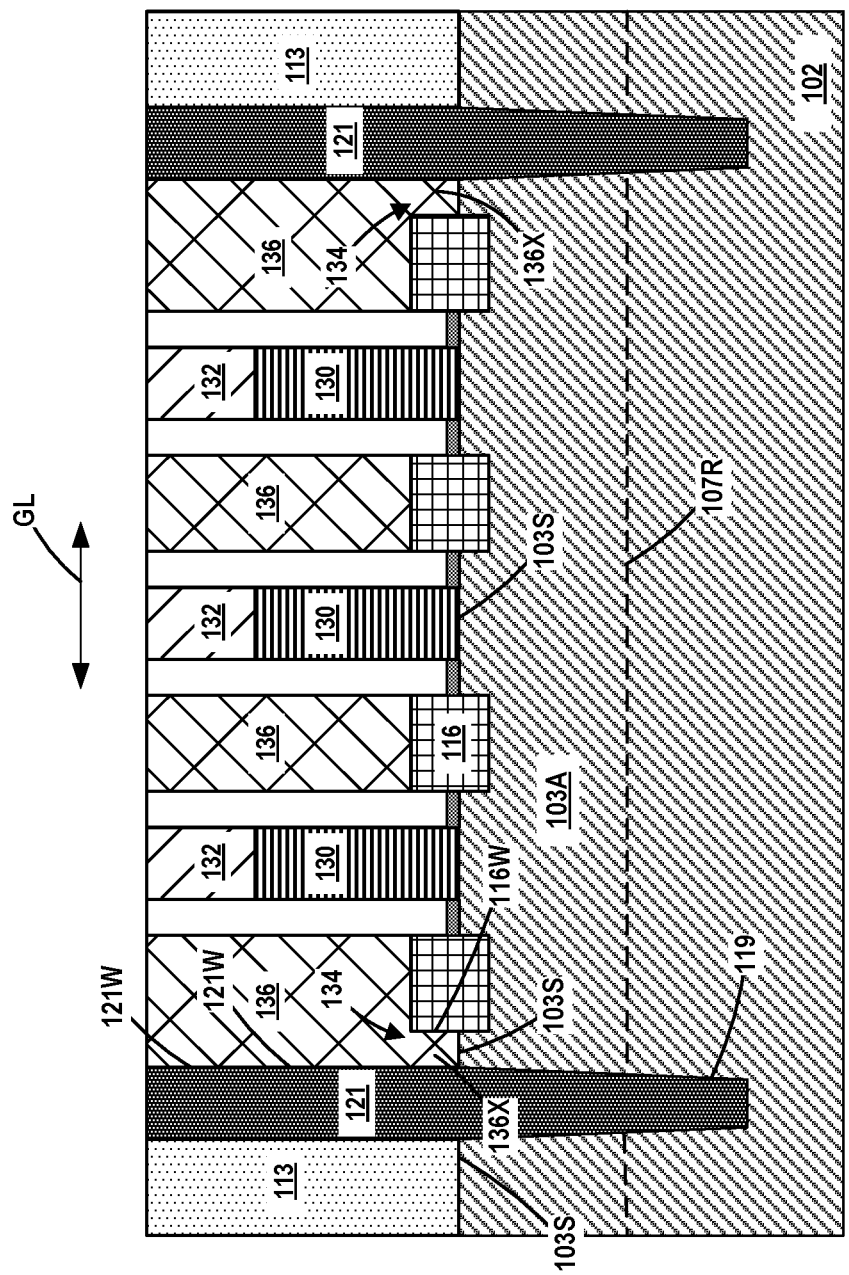

Of course, as will be readily appreciated by those skilled in the art after a complete reading of the present application, the subject matter disclosed herein may be employed in a variety of different applications. For example, FIG. 31 depicts an application in which a pair of spaced-apart SDB isolation structures 121 are positioned adjacent a single transistor device, with a gap 134 located between the SDB isolation structure 121 and a region of epi material 116 on each side of the transistor device. As another example, FIG. 32 depicts an application in which three illustrative transistor devices are positioned between a pair of spaced-apart SDB isolation structures 121. Note that the gap 134 is present between each of the SDB isolation structures 121 and the immediately adjacent region of epi material 116 on the outer transistor devices.

At the point of processing depicted in FIGS. 25-26 and 31-32, the fabrication of the product 100 may be completed by performing traditional manufacturing techniques to form various standard features on the IC product 100. For example, one or more layers of insulating material (not shown) may be formed on the product 100, followed by performing one or more CMP processes. At that point, traditional manufacturing operations may be performed to form various device level contact structures. More specifically, a gate contact may be formed to conductively contact one or more of the gate structures 130 and a plurality of source/drain contacts may be formed to conductively contact the conductive source/drain structures 136. Thereafter, one or more metallization layers (not shown), that constitute the overall wiring pattern for the integrated circuit product 100, may be formed on the product 100 by performing traditional manufacturing processes. These metallization layers are typically comprised of layers of insulating material with conductive metal lines or conductive vias formed in the layers of material. The first metallization layer in an integrated circuit product is typically referred to as the "M1" layer (or in some cases the "M0" layer), while the conductive vias that are used to establish electrical connection between the M1 layer and lower level conductive structures are typically referred to as "V0" vias.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a fin defined in a semiconductor substrate;
   an isolation structure that separates said fin into a first fin portion and a second fin portion;
   an epi semiconductor material positioned on said first fin portion in a source/drain region of a transistor device, wherein a lateral gap in a gate length direction of said transistor device is present between a first sidewall of said epi semiconductor material and a second sidewall of said isolation structure; and
   a conductive source/drain structure that is conductively coupled to said epi semiconductor material, wherein a gap portion of said conductive source/drain structure is positioned in said lateral gap and physically contacts said first sidewall and said second sidewall.

2. The product of claim 1, wherein said first fin portion comprises an upper surface and wherein said gap portion of said conductive source/drain structure physically contacts said upper surface of said first fin portion.

3. The product of claim 1, wherein said gap portion of said conductive source/drain structure extends downward past a bottom surface of said epi semiconductor material.

4. The product of claim 1, further comprising an isolation material with an upper surface that exposes an upper part of said first fin portion, wherein said gap portion of said conductive source/drain structure physically contacts said second sidewall of said isolation structure for substantially an entire distance extending from an upper surface of said epi semiconductor material to said upper surface of said isolation material.

5. The product of claim 4, wherein said isolation material is positioned above said semiconductor substrate, said isolation material comprising a lower surface, and wherein said isolation structure extends into said semiconductor substrate beyond a level corresponding to a position of said lower surface of said isolation material.

6. The product of claim 1, wherein said epi semiconductor material, when viewed in a cross-section taken through said epi semiconductor material in a gate width direction of said transistor device, has a substantially rhombus-like cross-sectional configuration.

7. The product of claim 5, wherein an end surface of said gap portion of said conductive source/drain structure contacts and engages said upper surface of said isolation material.

8. The product of claim 1, wherein said conductive source/drain structure comprises a metal silicide material and said semiconductor substrate comprises silicon.

9. An integrated circuit product, comprising:
   a fin defined in a semiconductor substrate;
   a single diffusion break (SDB) isolation structure that separates said fin into a first fin portion and a second fin portion, wherein said first fin portion comprises an upper surface and opposing sidewalls;
   an epi semiconductor material positioned on said first fin portion in a source/drain region of a transistor device, wherein a lateral gap in a gate length direction of said transistor device is present between a first sidewall of said epi semiconductor material and a second sidewall of said SDB isolation structure; and
   a conductive source/drain structure that is conductively coupled to said epi semiconductor material, wherein a gap portion of said conductive source/drain structure is positioned in said lateral gap and physically contacts said first sidewall, said second sidewall, said upper surface of said first fin portion and said opposing sidewalls of said first fin portion.

10. The product of claim 9, wherein said gap portion of said conductive source/drain structure extends downward past a bottom surface of said epi semiconductor material.

11. The product of claim 9, further comprising an isolation material with an upper surface that exposes an upper part of said first fin portion, wherein said gap portion of said conductive source/drain structure physically contacts said second sidewall of said SDB isolation structure for substantially an entire distance extending from an upper surface of said epi semiconductor material to said upper surface of said isolation material.

12. The product of claim 11, wherein said isolation material is positioned above said semiconductor substrate, said isolation material comprising a lower surface, and wherein said SDB isolation structure extends into said semiconductor substrate beyond a level corresponding to a position of said lower surface of said isolation material.

13. The product of claim 11, wherein an end surface of said gap portion of said conductive source/drain structure contacts and engages said upper surface of said isolation material.

14. A method of forming an integrated circuit product, comprising:
    forming a fin in a semiconductor substrate;
    forming a first sidewall spacer, wherein an interior surface of said first sidewall spacer defines an opening that is positioned above said fin;
    performing at least one etching process to remove a portion of said fin below said opening and form a trench that extends into said semiconductor substrate and separates said fin into a first fin portion and a second fin portion, wherein said first fin portion comprises an upper surface and opposing sidewalls and wherein a combination of said opening and said trench define an isolation structure opening;
    forming an isolation structure within said isolation structure opening;
    forming an epi semiconductor material on said first fin portion in a source/drain region of a transistor device, a sidewall of said epi semiconductor material contacting a sidewall of said first sidewall spacer;
    removing at least a portion of said first sidewall spacer so as to form a lateral gap, in a gate length direction of said transistor device, between said sidewall of said epi semiconductor material and a sidewall of said isolation structure; and
    forming a conductive source/drain structure that is conductively coupled to said epi semiconductor material, wherein a gap portion of said conductive source/drain structure is positioned in said gap and physically contacts said sidewall of said epi semiconductor material, said sidewall of said isolation structure and a surface of said fin.

15. The method of claim 14, wherein said first fin portion of said fin comprises an upper surface and opposing sidewalls and wherein said gap portion of said conductive source/drain structure physically contacts said upper surface of said first fin portion and said opposing sidewalls of said first fin portion.

16. The method of claim 15, wherein said gap portion of said conductive source/drain structure extends downward past a bottom surface of said epi semiconductor material.

17. The method of claim 14, wherein said product comprises an isolation material with an upper surface that exposes an upper part of said first fin portion, and wherein said method comprises forming said conductive source/drain structure such that said gap portion of said conductive source/drain structure physically contacts said sidewall of said isolation structure for substantially an entire distance extending from an upper surface of said epi semiconductor material to said upper surface of said isolation material.

18. The method of claim 17, wherein forming said trench comprises forming said trench such that it extends in said semiconductor substrate beyond a level corresponding to a position of a lower surface of said isolation material.

19. The method of claim 14, wherein forming said isolation structure comprises forming a single diffusion break (SDB) isolation structure.

20. The method of claim 14, wherein, after forming said fin and prior to performing said at least one etching process to remove a portion of said fin below said opening, the method comprises:
　forming a sacrificial gate structure and a sacrificial gate cap above said fin;
　forming a second sidewall spacer adjacent said sacrificial gate structure and said sacrificial gate cap;
　performing at least one etching process to remove a portion of an axial length of both said sacrificial gate structure and said sacrificial gate cap;
　performing a recess etching process to reduce a height of said second sidewall spacer so as to thereby form a recessed second sidewall spacer having a recessed upper surface; and
　forming said first sidewall spacer above said recessed upper surface of said recessed second sidewall spacer.

* * * * *